(12) United States Patent
Holzapfel et al.

(10) Patent No.: US 11,828,630 B2
(45) Date of Patent: Nov. 28, 2023

(54) OPTICAL POSITION-MEASURING DEVICE

(71) Applicant: DR. JOHANNES HEIDENHAIN GmbH, Traunreut (DE)

(72) Inventors: Wolfgang Holzapfel, Obing (DE); Daniel Frese, Traunstein (DE); Christoph Lingk, Traunstein (DE)

(73) Assignee: DR. JOHANNES HEIDENHAIN GmbH, Traunreut (DE)

( * ) Notice: Subject to any disclaimer, the term of this patent is extended or adjusted under 35 U.S.C. 154(b) by 782 days.

(21) Appl. No.: 16/926,571

(22) Filed: Jul. 10, 2020

(65) Prior Publication Data
US 2021/0010807 A1    Jan. 14, 2021

(30) Foreign Application Priority Data

Jul. 11, 2019   (DE) .................. 10 2019 210 274.3

(51) Int. Cl.
  *G01B 1/00*   (2006.01)
  *G01D 5/347*  (2006.01)
  *G01B 11/26*  (2006.01)

(52) U.S. Cl.
  CPC ........... *G01D 5/3473* (2013.01); *G01B 11/26* (2013.01); *G01D 5/34792* (2013.01)

(58) Field of Classification Search
None
See application file for complete search history.

(56) References Cited

U.S. PATENT DOCUMENTS

| | | | |
|---|---|---|---|
| 3,544,800 A | 12/1970 | Elliott | |
| 7,187,305 B2 * | 3/2007 | Ellis | H03M 1/308 250/231.16 |
| 2007/0075230 A1 | 4/2007 | Sun et al. | |
| 2011/0298411 A1 * | 12/2011 | Yoshida | H02K 11/22 250/208.2 |
| 2013/0301059 A1 | 11/2013 | Mayer et al. | |
| 2019/0219422 A1 | 7/2019 | Frese et al. | |

FOREIGN PATENT DOCUMENTS

| | | |
|---|---|---|
| DE | 11 2005 002 253 T5 | 10/2007 |
| DE | 10 2018 200 449 A1 | 7/2019 |
| EP | 2662666 A2 | 11/2013 |
| JP | 2003057074 A * | 2/2003 ............... G01D 5/38 |

* cited by examiner

*Primary Examiner* — Mark Hellner
(74) *Attorney, Agent, or Firm* — CARTER, DELUCA & FARRELL LLP

(57) ABSTRACT

In an optical position-measuring device for acquiring the rotational angle between two objects that are rotationally moveable relative to each other, a grating measuring standard rotating about an axis of rotation is arranged as a reflection grating. Position information both about an azimuthal rotary movement about the axis of rotation and about a radial displacement of the grating measuring standard is able to be obtained. At least one detection unit is used for scanning the rotating grating measuring standard in order to determine the azimuthal rotational angle as well as a radial displacement of the grating measuring standard. The neutral pivot points of the scanning of the grating measuring standard for the determination of the rotational angle and the displacement are situated in the same plane, with this plane being situated in parallel with the grating measuring standard. The neutral pivot point denotes the particular location about which the grating measuring standard or the detection unit is able to be tilted without a position offset.

9 Claims, 13 Drawing Sheets

FIG. 1C
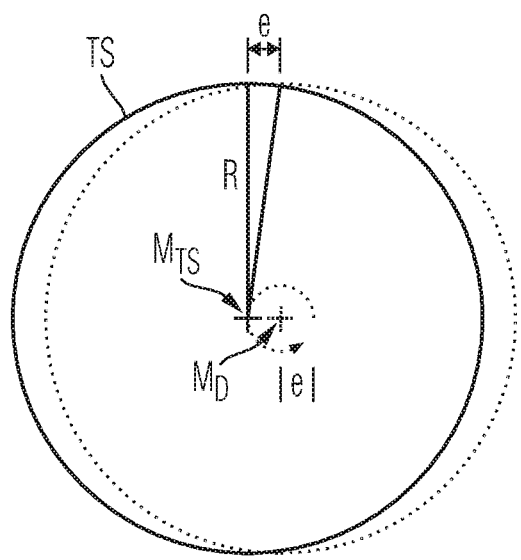
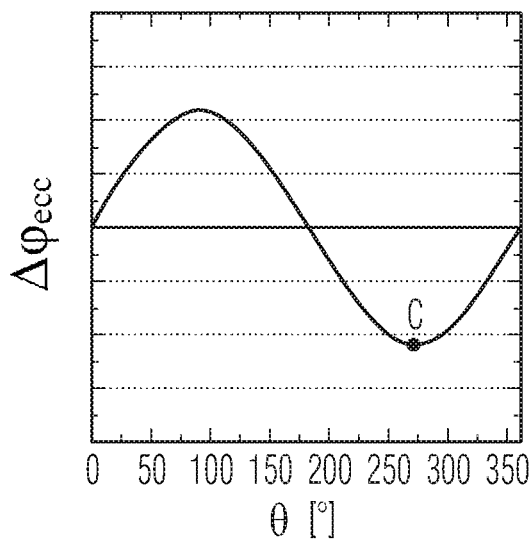
FIG. 1D
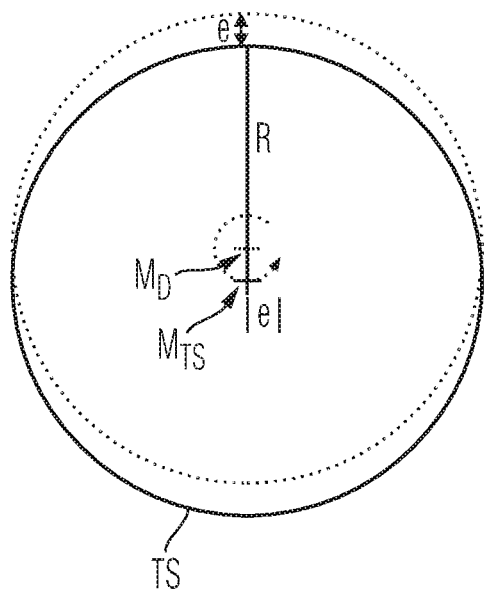
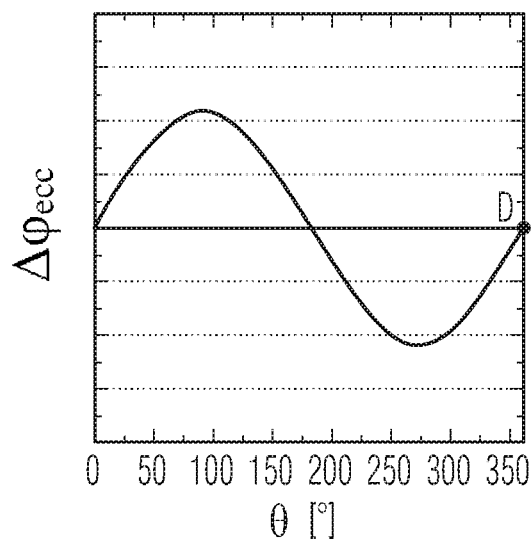

FIG. 2A
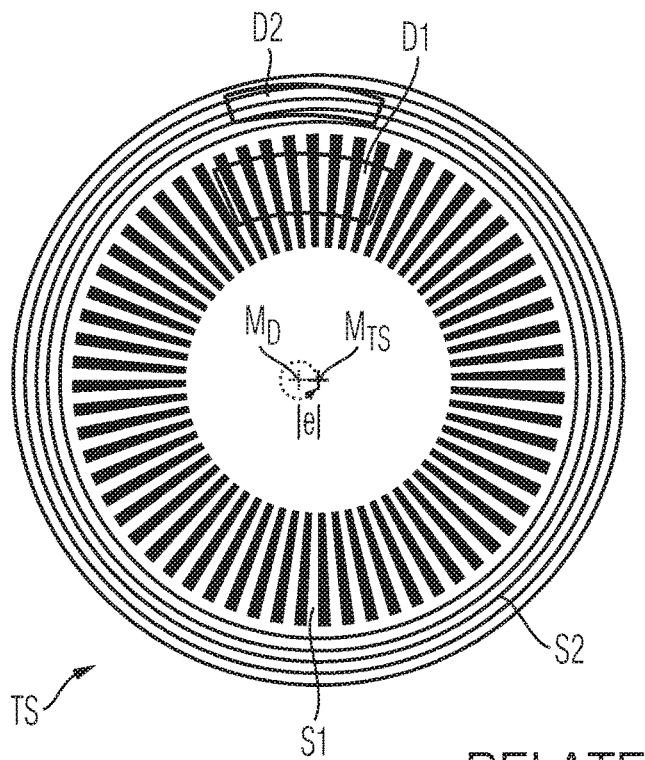 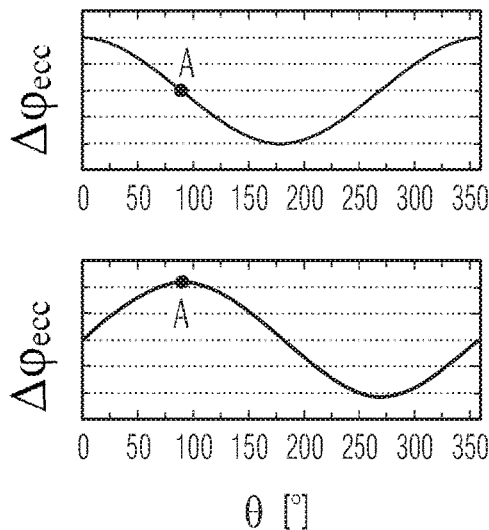
RELATED ART
FIG. 2B
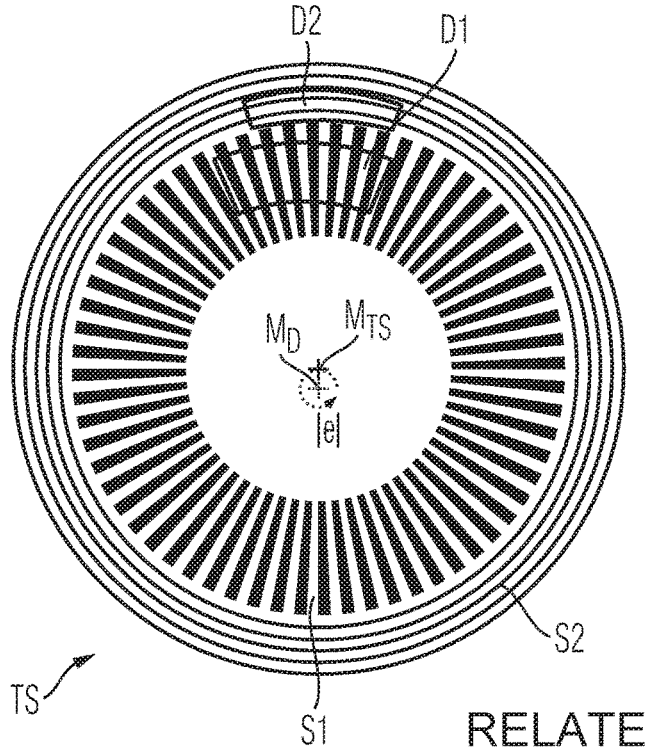 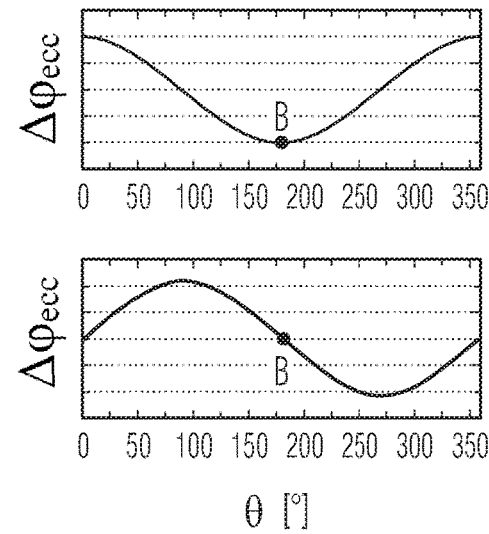
RELATED ART FIG. 2C
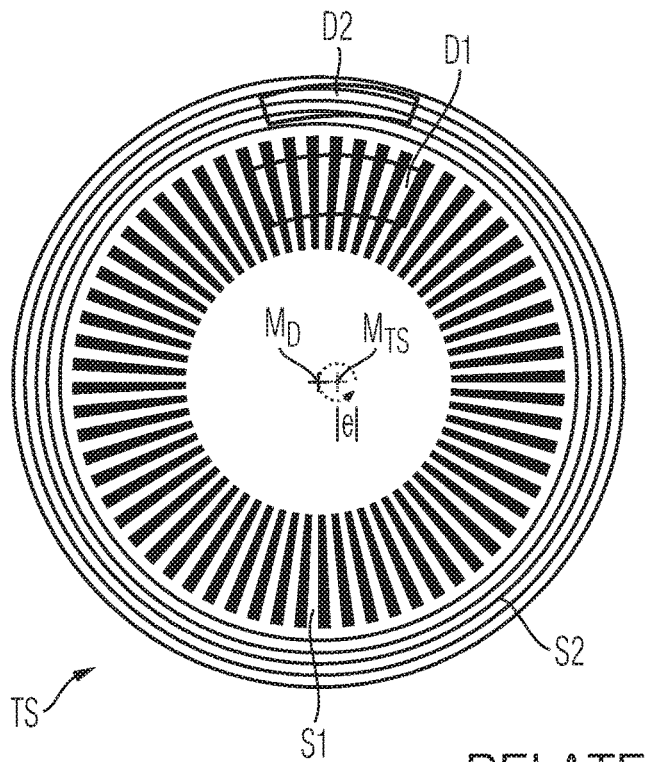
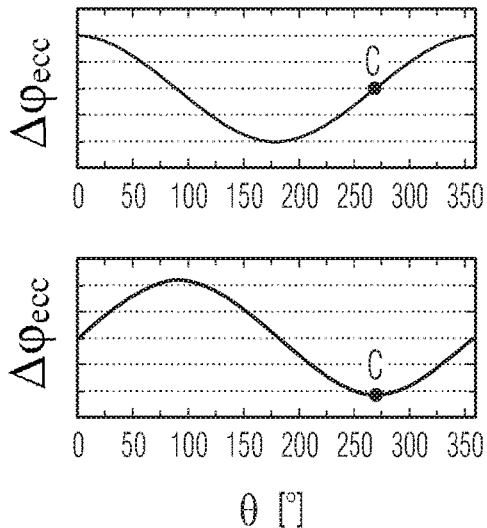
RELATED ART
FIG. 2D
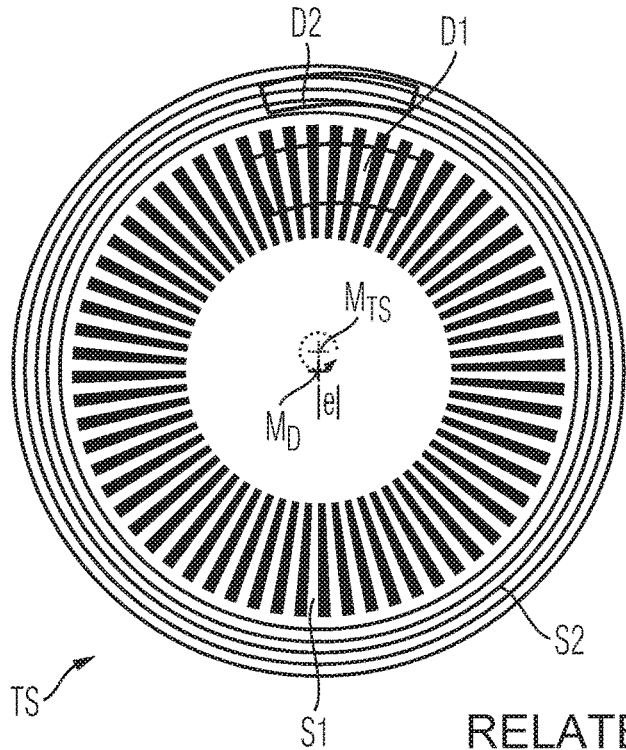
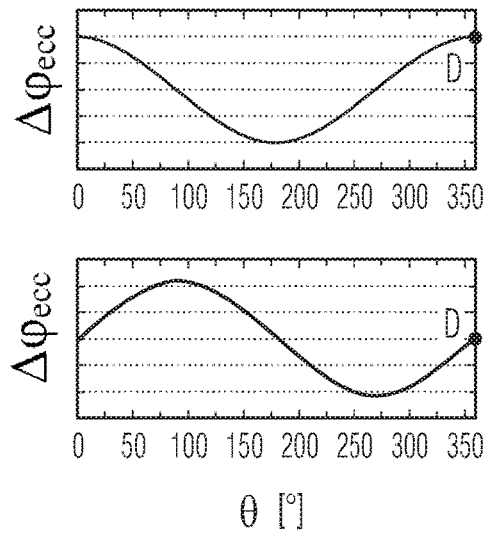
RELATED ART

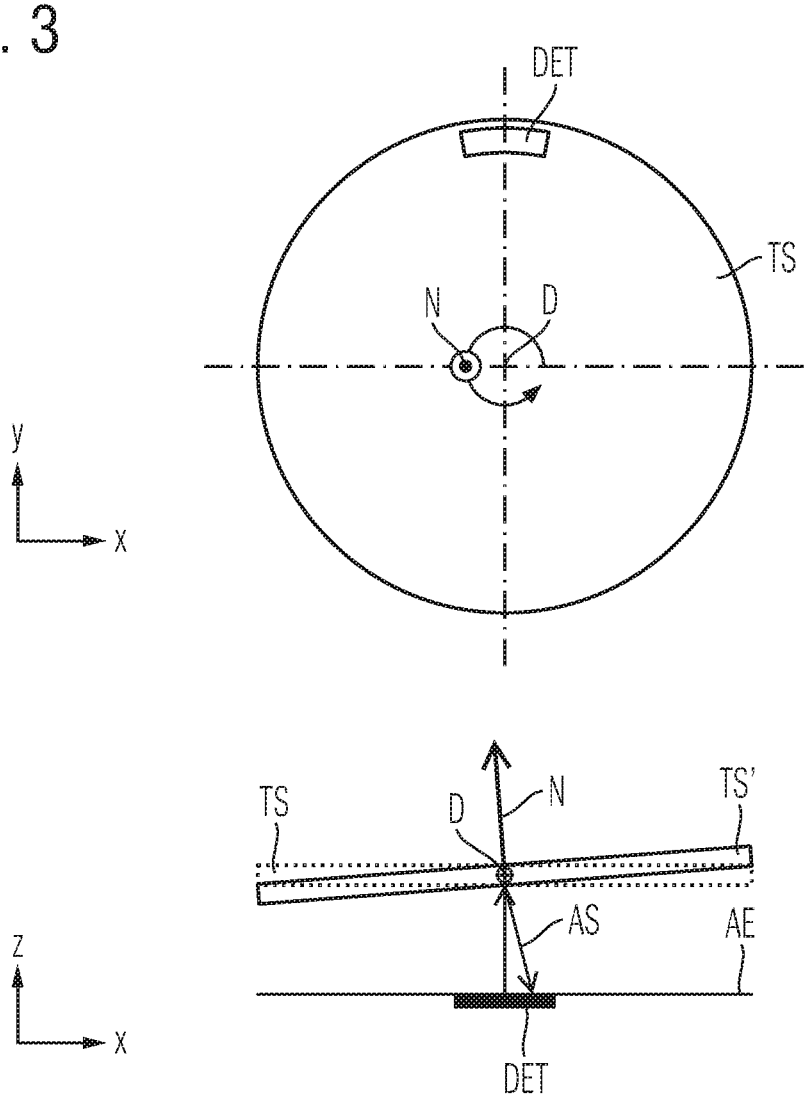

OPTICAL POSITION-MEASURING DEVICE

CROSS-REFERENCE TO RELATED APPLICATIONS

The present application claims priority to Application No. 10 2019 210 274.3, filed in the Federal Republic of Germany on Jul. 11, 2019, which is expressly incorporated herein in its entirety by reference thereto.

FIELD OF THE INVENTION

The present invention relates to an optical position-measuring device, e.g., for acquiring the rotational angle between two objects that are able to rotationally move relative to each other.

BACKGROUND INFORMATION

Generally, such position-measuring devices have a grating measuring standard, which rotates about an axis of rotation and is situated on what is referred to as a graduated disk. The grating measuring standard is usually arranged as a radial graduation, which, when scanned with the aid of a suitable scanning unit, makes it possible to generate position signals with regard to the rotary movement of the graduated disk. The generated position signals characterize the azimuthal rotational angle between the two objects that are rotationally movable relative to each other. Among other things, the scanning unit required for this purpose includes at least one appropriately arranged optoelectronic detector system. The two objects whose position or angular relative orientation with respect to each other is to be determined are connected to the rotating graduated disk on the one hand and to the stationary part of the position-measuring device on the other hand. In a typical application, for example, the rotary movement of a rotating drive shaft in relation to the stationary drive housing is determined with the aid of such a position-measuring device. The position signals or rotational angles acquired in this manner are able to be utilized in a conventional manner for the drive control.

Problems may arise, for example, if the rotating graduated disk and the stationary components of the position-measuring device are not already assembled relative to one another at the factory but, for instance, the assembly of the separately delivered graduated disk and the scanning unit(s) is carried out by the customer. In such a case, it may not always be ensured that the graduated disk and thus the scanned grating measuring standard are mounted in a precisely centered manner relative to the actual axis of rotation. However, this is an important precondition for the evaluation of the generated position signals. In practice, position signals that include what are referred to as eccentricity errors are therefore often produced. These eccentricity errors, which lie in the range of the eccentricity, are attributable to the fact that the actual axis of rotation does not coincide with the axis of the rotating graduated disk or grating measuring standard. The errors caused by an eccentric mounting of the graduated disk in an assembly at the customer site are considerable and significantly affect the maximum measuring accuracy of the corresponding position-measuring devices.

The corresponding correlations will be described in more detail with reference to FIGS. 1A to 1D, each of which illustrates a graduated disk TS, rotating about axis of rotation $M_D$, in different rotational positions A to D, with axis $M_{TS}$ of the grating measuring standard or graduated disk TS having an eccentricity e with respect to axis of rotation $M_D$. In addition, each of FIGS. 1A to 1D illustrates the eccentricity-related rotational angle error $\Delta\varphi_{ecc}(\Theta)$ in the corresponding rotational position A to D of graduated disk TS. The grating measuring standard on graduated disk TS, is arranged as a radial graduation and is situated in the form of a ring-shaped graduation track in the middle of scanning radius R about axis $M_{TS}$ of the grating measuring standard or graduated disk TS.

In such a case, the tangential displacement $\Delta t(\Theta)$ of graduated disk TS at the scanning location of the grating measuring standard results as follows:

$$\Delta t(\Theta) = e \cdot \sin(\Theta + \Delta\Theta_1) \qquad \text{(Eq. 1)}$$

in which $\Delta t(\Theta)$ represents the tangential displacement of the graduated disk, $\Theta$ represents the rotational angle of the graduated disk, $e$ represents the eccentricity, and $\Delta\Theta_1$ represents the phase position of the eccentricity-related rotational angle error.

The azimuthal scanning of the grating measuring standard on graduated disk TS supplies a rotational angle value $\varphi_{meas}(\Theta)$, which has a rotational angle error $\Delta\varphi_{ecc}(\Theta)$ caused by the present eccentricity e, according to the following relationship:

$$\varphi_{meas}(\Theta) = \Theta + \Delta_{ecc}(\Theta) \qquad \text{(Eq. 2)}$$

in which:

$$\Delta\varphi_{ecc}(\theta) = \frac{\Delta t(\theta)}{R} = \frac{e}{R} \cdot \sin(\theta + \Delta\theta_1) \qquad \text{(Eq. 3)}$$

and in which $\varphi_{meas}(\Theta)$ represents the rotational angle value of the azimuthal scanning, $\Delta\varphi_{ecc}(\Theta)$ represents the eccentricity-related rotational angle error, $\Theta$ represents the rotational angle of the graduated disk, $e$ represents the eccentricity, $\Delta\Theta_1$ represents the phase position of the eccentricity-related rotational angle error, and R represents the scanning radius.

As illustrated in FIGS. 1A to 1D, and also indicated in Equation 3, the eccentricity-related rotational angle error $\Delta\varphi_{ecc}(\Theta)$ is periodic and repeats at the periodicity of a full rotation of graduated disk TS. In rotational positions A and C of graduated disk TS according to FIGS. 1A and 10, the eccentricity-related rotational angle error $\Delta\varphi_{ecc}(\Theta)$ is maximal, and in rotational positions B and D of graduated disk TS according to FIGS. 1B and 1D, eccentricity-related rotational angle error $\Delta\varphi_{ecc}(\Theta)$ disappears.

There are a number of conventional approaches that are intended to address eccentricity errors in rotatory position-measuring devices. For example, German Patent Document No. 11 2005 002 253, and U.S. Pat. No. 7,187,305, provide that, in addition to the ring-shaped graduation track, which is used to acquire the rotational movement and has a radial graduation and an associated detection unit or scanning point, a further ring-shaped graduation track is positioned in parallel, which includes graduation or grating lines placed in a concentric and ring-shaped manner. Via an additional detection unit, which is allocated to the additional graduation track and situated in the same azimuth position as the first detection unit, a possibly existing deflection of the graduated disk in the radial direction is able to be acquired in quantitative terms and utilized for correcting the position signals or rotational angles of actual interest and which describe the rotation of the graduated disk about the axis of rotation.

In the following text, the principle for correcting eccentricity errors on which German Patent Document No. 11 2005 002 253, and U.S. Pat. No. 7,187,305, is based is described with reference to FIGS. 2A to 2D. FIG. 2A to 2D illustrate graduated disk TS including two graduation tracks S1, S2 and associated detection units D1, D2 in different rotational positions A to D, with axis $M_{TS}$ of the grating measuring standard or graduated disk TS having an eccentricity e relative to axis of rotation $M_D$. FIGS. 2A to 2D also illustrate the eccentricity-related deflections $\Delta r_{ecc}(\Theta)$ of graduated disk TS in the radial direction (upper illustration) and eccentricity-related rotational angle errors $\Delta\varphi_{ecc}(\Theta)$ (lower illustration) for the respective rotational position A to D.

In the case of an eccentric movement of graduated disk TS, its radial deflection $\Delta r_{ecc}(\Theta)$ is linked with tangential displacement $\Delta t(\Theta)$ by the following relationship:

$$\Delta r_{ecc}(\theta) = \Delta t\left(\theta + \frac{\pi}{2}\right) \quad \text{(Eq. 4)}$$

in which $\Delta r_{ecc}(\Theta)$ represents the radial deflection of the graduated disk, $\Delta t(\Theta)$ represents the tangential displacement of the graduated disk, and $\theta$ represents the rotational angle of the graduated disk.

Thus, the following relationship applies to eccentricity-related rotational angle error $\Delta\varphi_{ecc}(\Theta)$:

$$\Delta\varphi_{ecc}(\theta) = \frac{1}{R} \cdot \Delta r_{ecc}\left(\theta - \frac{\pi}{2}\right) \quad \text{(Eq. 5)}$$

in which $\Delta\varphi_{ecc}(\Theta)$ represents the eccentricity-related rotational angle error, $\Delta r_{ecc}(\Theta)$ represents the radial deflection of the graduated disk, R represents the scanning radius, and $\theta$ represents the rotational angle of the graduated disk.

As illustrated in FIGS. 2A to 2D, the measured value of the radial graduated disk deflection $\Delta r_{ecc}(\Theta)$, obtained by scanning the graduation lines in graduation track S2 arranged in ring-shaped form, is phase-shifted by precisely 90° relative to eccentricity-related rotational angle error $\Delta\varphi_{ecc}(\Theta)$. This correlation may be utilized for a correction in that the measured value of radial graduated disk deflection $\Delta r_{ecc}(\Theta)$ is recorded for a full rotation of graduated disk TS during a calibration operation after the installation of graduated disk TS, is further processed and scaled in the process by the factor 1/R and stored as a rotational-angle-dependent correction value $\varphi_{corr}(\Theta)$, e.g., in a table, according to the following relationship:

$$\varphi_{corr}(\theta) = \frac{1}{R} \cdot \Delta r_{ecc}(\theta) \quad \text{(Eq. 6)}$$

in which $\varphi_{corr}(\Theta)$ represents the rotational-angle-dependent correction value, $\Delta r_{ecc}(\Theta)$ represents the radial deflection of the graduated disk, R represents the scanning radius, and $\theta$ represents the rotational angle of the graduated disk.

During the measuring operation, the actually output and corrected angular position $\varphi_{out}$ is corrected with the aid of a correction value $\varphi_{corr}(\Theta)$, offset by 90°, from the table.

By proceeding in this manner, no external reference system is required for the calibration of the azimuthal rotational angle value. Instead, the position-measuring device ascertains all required correction information on its own.

For optical position-measuring devices that operate using transmitted light, it is thereby possible to correct the measuring errors caused by a possible eccentricity of the graduated disk or the grating measuring standard. However, in particular in the case of rotatory optical position-measuring devices using incident light scanning, still further errors result that may have a considerable adverse effect on the measuring accuracy. Such errors are caused by a possible tumbling motion of the graduated disk if it is not ideally positioned or supported. German Patent Document No. 11 2005 002 253, and U.S. Pat. No. 7,187,305, do not provide any solutions for correcting errors of the foregoing type.

SUMMARY

Example embodiments of the present invention provide an optical position-measuring device, or optical position encoder, for acquiring relative rotational movements by which not only eccentricity-related errors during the rotational angle determination are able to be compensated for but also errors that are caused by tumbling of the scanned grating measuring standard or graduated disk.

According to an example embodiment of the present invention, an optical position-measuring device, for acquiring the rotational angle between two objects that are able to rotate relative to each other, includes a grating measuring standard, which rotates about an axis of rotation and is arranged as a reflection grating and from whose scanning position information both about an azimuthal rotary movement about the axis of rotation and about a radial displacement of the grating measuring standard is able to be generated. In addition, at least one detection unit for scanning the rotating grating measuring standard is provided in order to determine the azimuthal rotational angle as well as a radial displacement of the grating measuring standard. In this context, the neutral pivot points of the scanning of the grating measuring standard for determining the rotational angle and the displacement are situated in the same plane, with this plane being situated in parallel with the grating measuring standard, and the neutral pivot point denoting the particular location about which the grating measuring standard or the detection unit is able to be tilted without a position offset.

It is possible that the grating measuring standard includes a radial graduation as well as an annular graduation situated next to it.

A first detection unit is able to be used for scanning the radial graduation and a second detection unit is able to be used for scanning the annular graduation.

It is furthermore possible that the grating measuring standard includes stripe elements, which are disposed in an annular and periodic manner at a first measuring standard periodicity, with the stripe elements having a radial orientation in the longitudinal extension direction, and for the absolute position encoding, the stripe elements have a periodic structure with a second measuring standard periodicity along their longitudinal extension direction.

The detection unit may have a single light source as well as a single detector system.

The detector system may be arranged as a two-dimensional detector system with a plurality of detector elements and a plurality of detector columns having multiple detector elements in each case, with the detector columns being periodically disposed at a first detection periodicity along the ring-shaped placement direction, and the detector elements in the detector columns being periodically arranged at a second detection periodicity.

The optical scanning of the grating measuring standard may be provided as central projection scanning using the image scale β=2, and may include a divergent light source as well as a detector system, which has a periodic arrangement along at least one direction.

In addition, the optical position-measuring device may include a signal processing unit, which is configured and arranged such that: the rotational-angle-dependent measured values, obtained during a calibration operation across at least one full rotation of the grating measuring standard, are further processed into a radial displacement of the grating measuring standard and are able to be stored as rotational-angle-dependent correction values in a memory of the signal processing unit; and the rotational-angle-dependent correction values stored in the memory are utilized by the signal processing unit in a measuring operation for correcting the measured azimuthal rotational angle with regard to existing eccentricity and tumbling errors.

The signal processing unit may be configured and arranged so that that the rotational-angle-dependent measured values with regard to a radial displacement of the grating measuring standard, obtained during a calibration operation, are utilized by the signal processing unit during a measuring operation for the correction of a rotational angle, offset by 90°, with regard to existing eccentricity and tumbling errors.

The signal processing unit may correct the rotational angle for existing eccentricity and tumbling errors, according to the following relationship:

$$\varphi_{out} = \varphi_{meas} - \varphi_{corr}((\varphi_{meas} - \pi/2)$$

in which $\varphi_{out}$ represents the output, corrected angular position, $\varphi_{meas}(\Theta)$ represents the rotational angle value of the azimuthal scanning, and $\varphi_{corr}(\Theta)$ represents the rotational-angle-dependent correction value.

By the measures described herein, the rotational angle measured by the position-measuring device is able to be corrected both for possibly existing eccentricity errors and simultaneously also for possible tumbling errors of the grating measuring standard or graduated disk. The latter constitute a considerable error source, in particular in the case of optical position-measuring devices featuring incident-light scanning.

Using a particular grating measuring standard, the information required for this purpose is able to be obtained from a single scanning point. A very compact configuration of the corresponding position-measuring device may therefore be obtained.

Further features and aspects of example embodiments of the present invention are described in more detail below with reference to the appended Figures.

BRIEF DESCRIPTION OF THE DRAWINGS

FIGS. 1A to 1D illustrate an eccentrically disposed graduated disk in different rotational positions in each case and the respective associated eccentricity-related angular deviations.

FIGS. 2A to 2D illustrate an eccentrically disposed graduated disk having an additional graduation track, in different rotational positions, according to a conventional arrangement, and also the respective associated radial graduated disk deflections and rotational angle errors.

FIG. 3 illustrates the relationships in the case of a tumbling graduated disk during incident-light scanning.

DETAILED DESCRIPTION

Figure 1A:
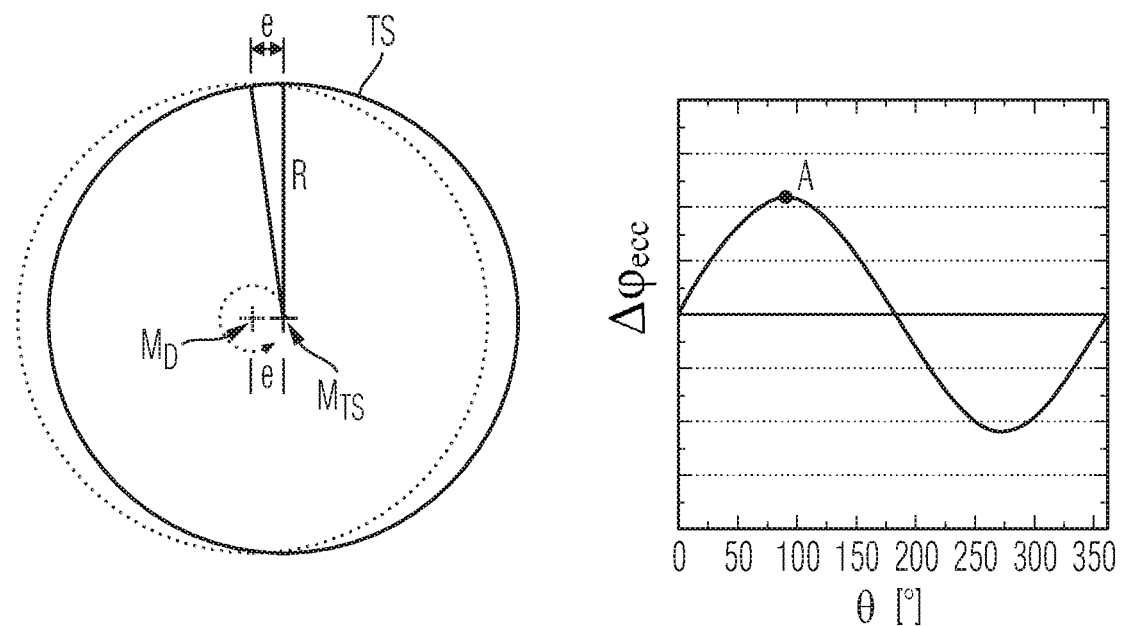
Figure 1B:
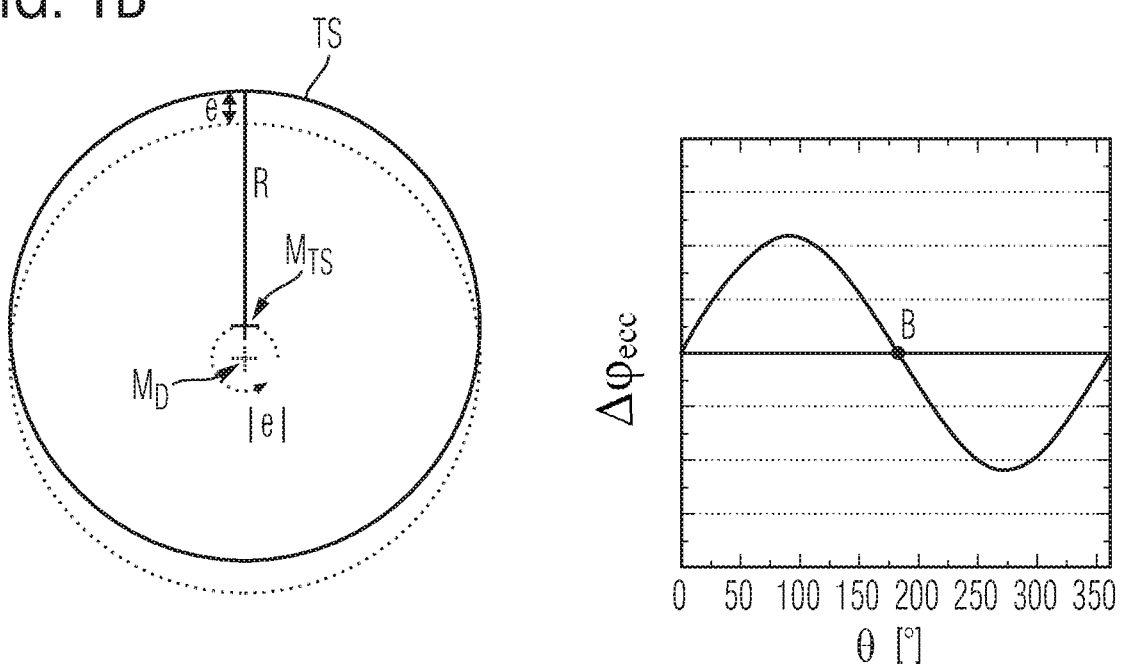
Figure 4A:
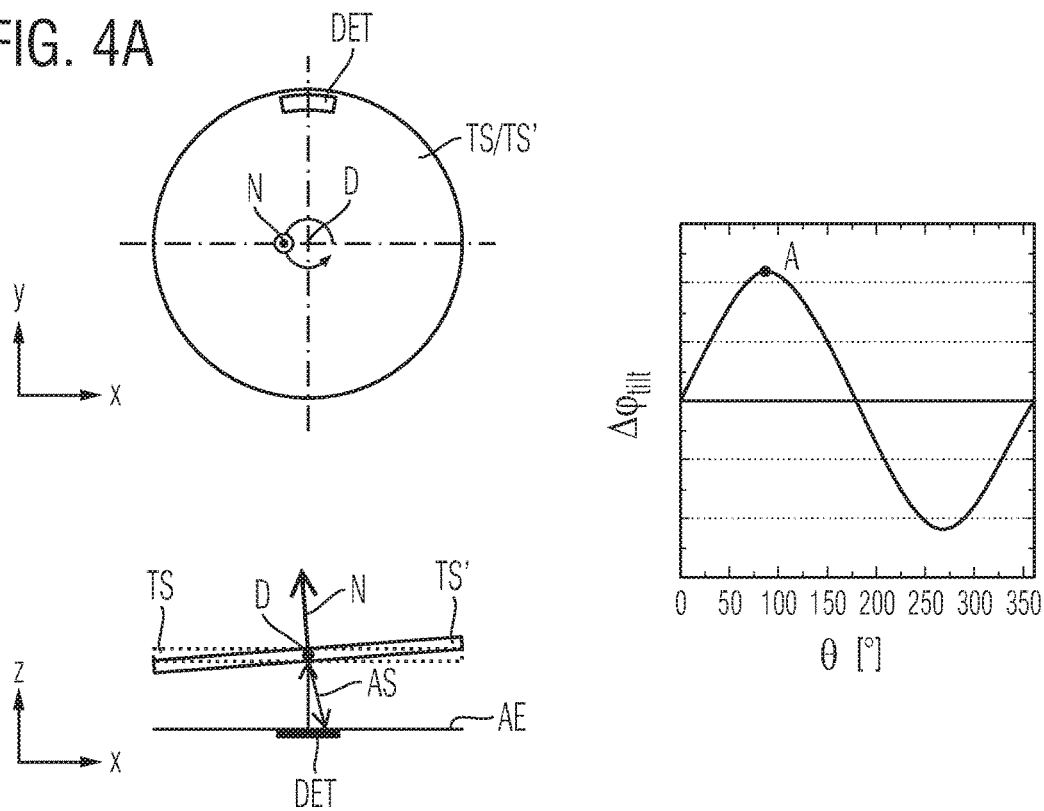
FIGS. 4A to 4D illustrate the influence of a tumbling graduated disk on the measured rotational angle, similar to the illustrations provided in FIGS. 1A to 1D.
Figure 4B:
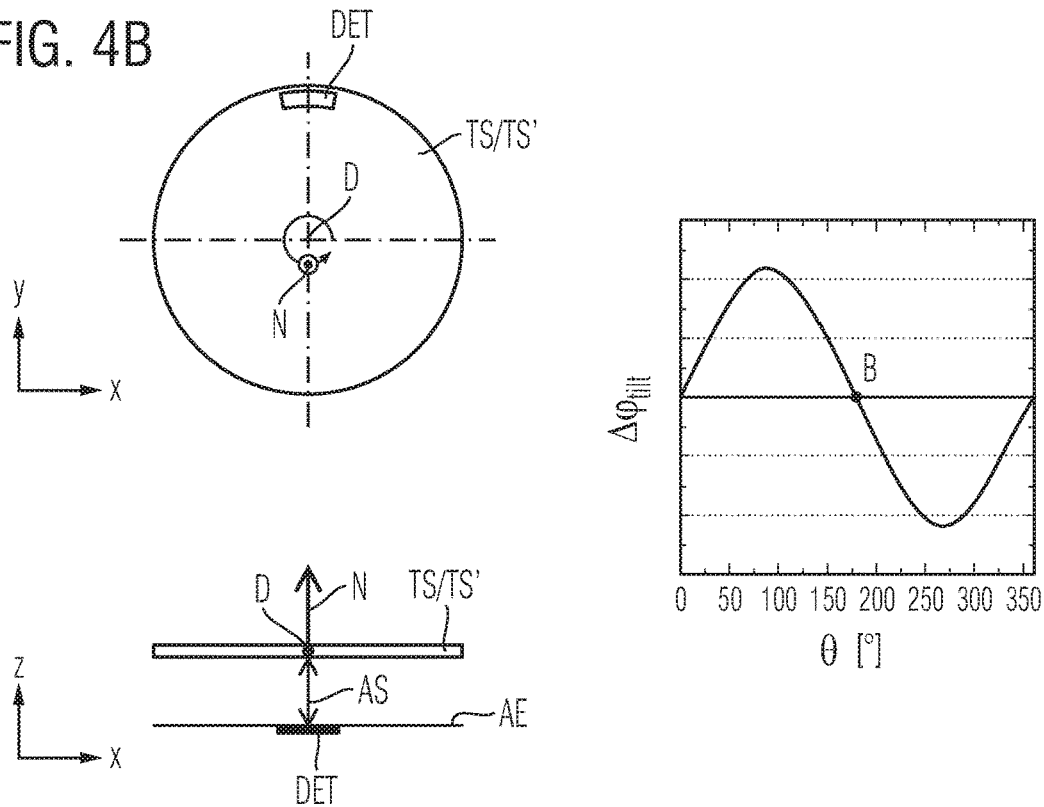
Figure 4C:
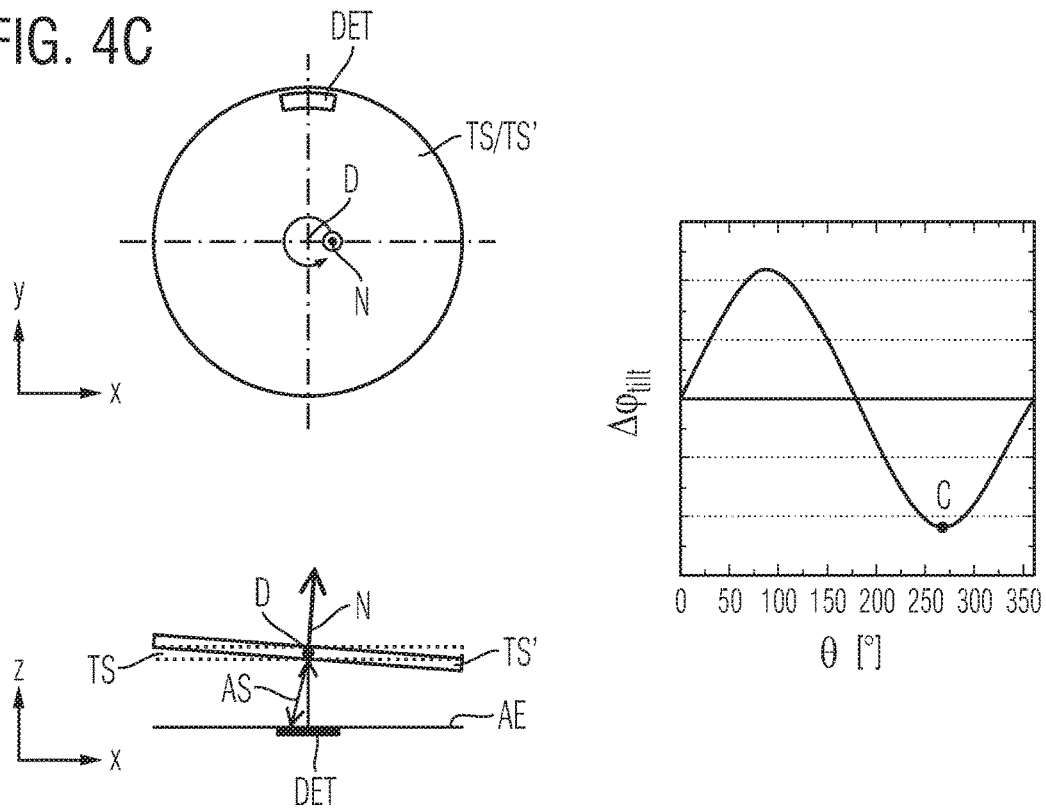
Figure 4D:
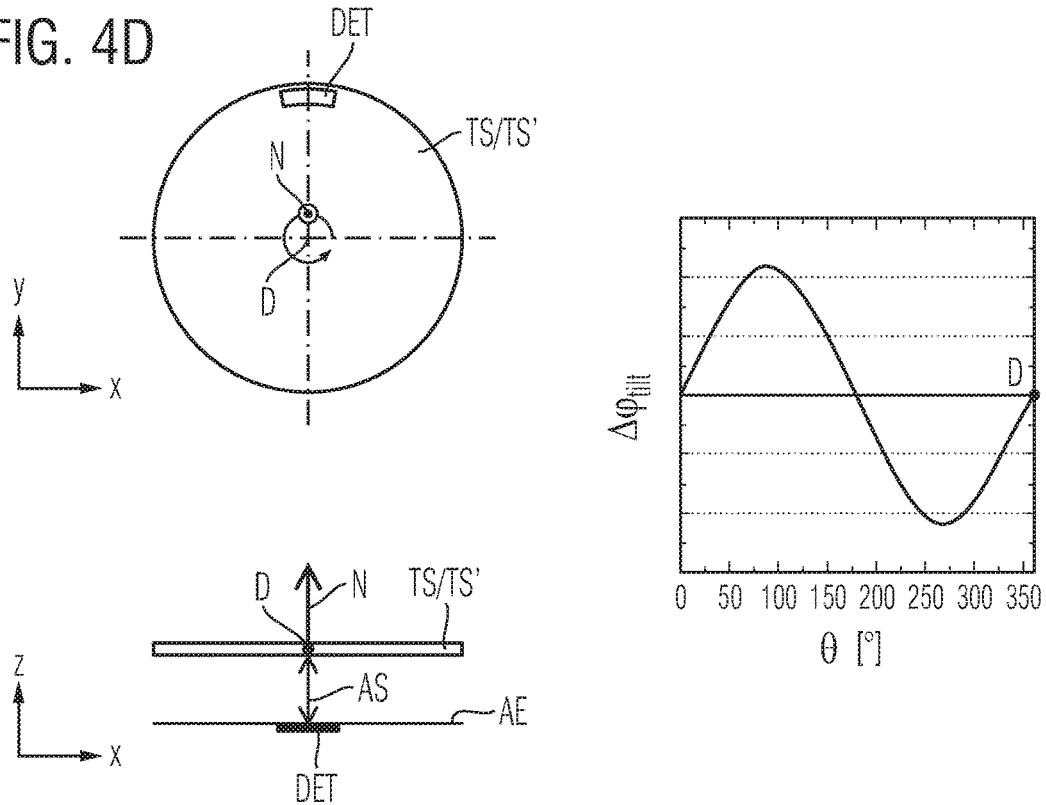

According to German Patent Document No. 11 2005 002 253, and U.S. Pat. No. 7,187,305, each of which is expressly incorporated herein in its entirety by reference thereto, mentioned above, rotatory optical position-measuring devices having grating measuring standards that are scanned using transmitted light substantially exhibit only eccentricity errors as an error contribution to a position determination. In the case of rotatory optical position-measuring devices featuring incident light scanning, an additional error contribution is present as well, which is caused by a possible tumbling motion of the grating measuring standard or graduated disk. Such a tumbling motion may occur when the graduated disk in the respective measuring system is not correctly supported or mounted.

The effect of a tumbling graduated disk scanned using incident light on the position measurement is described with reference to FIG. 3. The upper portion of FIG. 3 provides a schematic top view of graduated disk TS, and the lower portion of FIG. 3 provides a schematic side view of the position-measuring device. Indicated in the form of a dashed line in the lower portion of FIG. 3 is correctly mounted graduated disk TS without any tumbling motion, and the solid line indicates graduated disk TS', which is tilted about pivot point D, i.e., a tumbling graduated disk.

In the side view, tumbling graduated disk TS' is illustrated in FIG. 3 by a normal vector N, which is tilted in this view. The light-sensitive area of detection unit DET is situated in scanning plane AE, and scanning beam bundles AS, which are only schematically indicated and emitted by a light source in detection unit DET, are reflected by graduated disk TS', which is tilted in the illustrated state, and a light pattern generated via the scanning impinges upon detection unit DET with an offset. This means that detection unit DET acquires a position that is offset, i.e., deviates, from the true position. If graduated disk TS rotates, the tip of normal vector N of graduated disk TS describes a circular path about pivot point D, as illustrated in the upper portion of FIG. 3.

Analogous to the above discussion relating to FIGS. 1A to 1D, it is also possible to illustrate the effect of a possible tumbling motion of graduated disk TS on the resulting measuring error. This is illustrated in FIGS. 4A to 4D.

As illustrated in FIGS. 4A to 4d, the tumbling-related rotational angle error $\Delta\varphi_{tilt}$ is maximal in rotational positions A and C of graduated disk TS. In rotational positions B and D, on the other hand, in which only a radial displacement of the light pattern is present, tumbling-related rotational angle error $\Delta\varphi_{tilt}$ vanishes.

In an incident light scan, rotational angle error $\Delta\varphi_{tilt}$, caused by the tumbling motion of graduated disk TS, is described by the following relationship:

$$\Delta\varphi_{tilt}=b\cdot\sin(\theta+\Delta\theta_2) \quad \text{(Eq. 7)}$$

in which $\Delta\varphi_{tilt}$ represents the tumbling-related rotational angle error, b represents the amplitude of the tumbling-related rotational angle error, $\theta$ represents the rotational angle of the graduated disk, and $\Delta\Theta_2$ represents the phase position of the tumbling-related rotational angle error.

Overall, the total measuring error $\Delta\varphi_{total}$ during the position determination results from the sum of the eccentricity- and tumbling-related components of rotational angle error $\Delta\varphi_{ecc}$, $\Delta\varphi_{tilt}$ according to relationships 3 and 7, as follows:

$$\Delta\varphi_{total}=\Delta\varphi_{ecc}+\Delta\varphi_{tilt}=a\cdot\sin(\theta+\Delta\theta_1)+b\cdot\sin(\theta+\Delta\theta_2) \quad \text{(Eq. 8)}$$

in which $\Delta\varphi_{total}$ represents the total measuring error, $\Delta\varphi_{ecc}$ represents the eccentricity-related rotational angle error, $\Delta\varphi_{tilt}$ represents the tumbling-related rotational angle error, a (which equals e/R) represents the amplitude of the eccentricity-related rotational angle error, b represents the amplitude of the tumbling-related rotational angle error, $\theta$ represents the rotational angle of the graduated disk, $\Delta\Theta_1$ represents the phase position of the eccentricity-related rotational angle error, and $\Delta\Theta_2$ represents the phase position of the tumbling-related rotational angle error.

Figure 5:
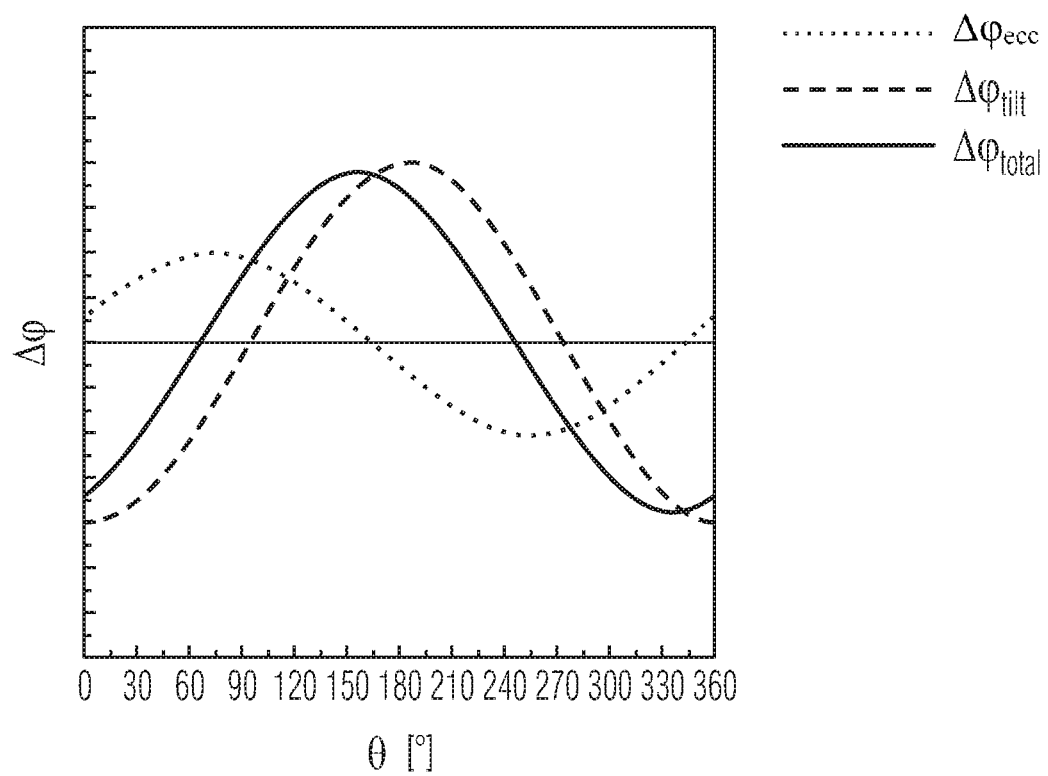
FIG. 5 illustrates the errors in the measured rotational angle caused by eccentricity and tumbling.

FIG. 5 illustrates the different components of rotational angle error $\Delta\varphi_{ecc}$, $\Delta\varphi_{tilt}$ as well as the resulting total measuring error $\Delta\varphi_{total}$ according to relationship 8 across an entire graduated disk rotation. The phase positions and amplitudes of the eccentricity-related rotational angle errors $\Delta\varphi_{ecc}$ and the tumbling-related rotational angle errors $\Delta\varphi_{tilt}$ have been selected so that they do not agree and the phase position of total measuring error $\Delta\varphi_{total}$ therefore also differs from the phase positions of the different error components. As illustrated in FIG. 5, resulting total measuring error $\Delta\varphi_{total}$ also has a periodicity of 360°.

To allow for a simultaneous and reliable correction of the eccentricity- and tumbling-related rotational angle errors $\Delta\varphi_{ecc}$, $\Delta\varphi_{tilt}$ during the incident light scanning of a rotating grating measuring standard, certain measures are required with regard to the provided scans, in particular if the correction mechanism described in German Patent Document No. 11 2005 002 253, and U.S. Pat. No. 7,187,305, mentioned above, is to be used. Important in this context is the position of that which is referred to as the neutral pivot point of the scanning for determining the rotational angle and displacement. The meaning of the neutral pivot point of a scanning operation is described in more detail below with reference to two different optical scanning alternatives.

Figure 6A:
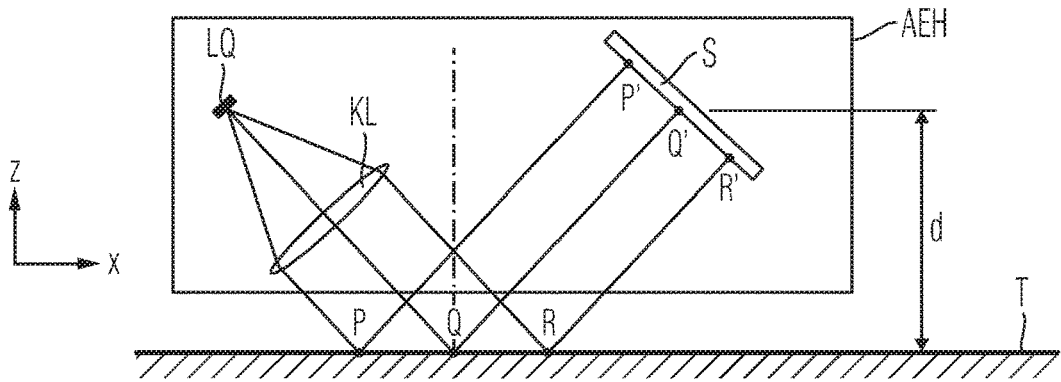
FIGS. 6A to 6C illustrate the neutral pivot point in a first scanning arrangement.
Figure 6B:
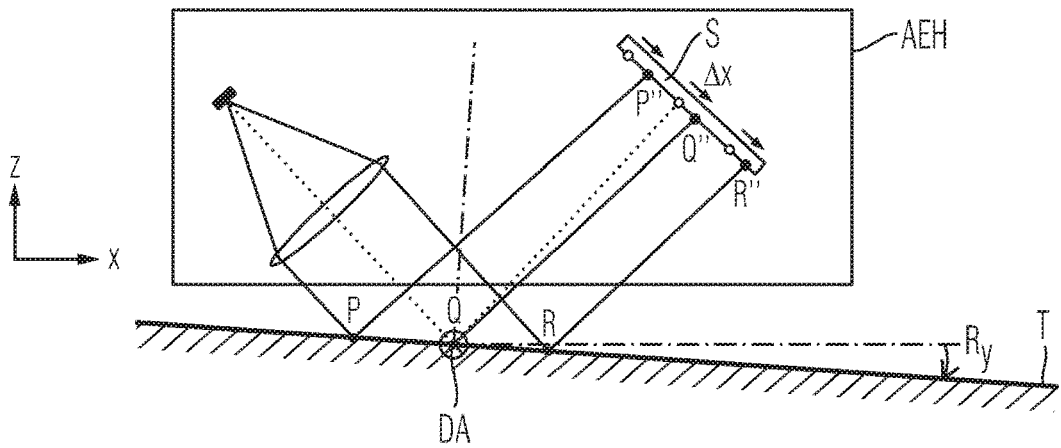
Figure 6C:
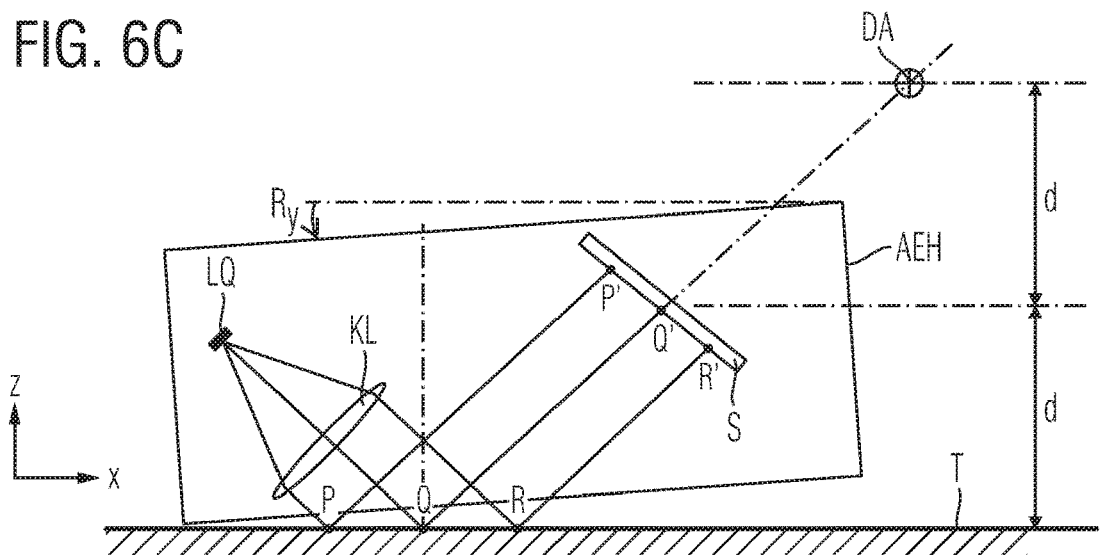

FIGS. 6A to 6C illustrate the case of a first optical scanning for which the neutral pivot point of a scanning operation is to be described, for example.

FIG. 6A schematically illustrates the optical scanning of a reflective grating measuring standard on a scale T with the aid of a scanning unit AEH. Situated in scanning unit AEH is a light source LQ, the light of which is collimated by a collimator lens KL and impinges upon the grating measuring standard on scale T. The radiation reflected by scale T reaches a sensor S in scanning unit AEH, which is disposed at a scanning distance d above scale T. The center beam of collimator lens KL and the two edge beams that are incident on scale T at points P, Q, and R are explained as an example of the scanning beam characteristic. As illustrated, the radiation reflected by points P, Q, and R on scale T impinge upon points P', Q', and R' on sensor S.

In the event that scale T is tilted, the resulting radiation characteristic of the respective scanning now depends on the particular point or the particular axis of rotation DA about which scanning unit AEH is rotated or tilted. In the case of FIG. 6B, axis of rotation DA about which tilting at an angle $R_y$ results is located in point Q and thus on scale T. Since the angle of incidence in the selected scanning is identical with the angle of emergence, in a tilted position the beam reflected by point Q no longer impinges upon point Q' on sensor S, as in an untitled case, but upon point Q", offset by an amount $\Delta x$, in the detection plane of sensor S. In a similar manner, in the tilted state, the beams reflected by points P and R on scale T impinge upon points P''' and R''', respectively, in sensor S. The magnitude of the tilting-related offset $\Delta x$ is basically able to be precisely indicated in the form of an equation but is of no importance for the following observations. In the final analysis, the tilting about rotational axis DA thus causes sensor S to detect a position offset because the light pattern has traveled further on sensor S as a result of the tilting, although scanning unit AEH is still positionally situated at the same x-position.

In order to illustrate the importance of the respective position of axis of rotation DA about which tilting results, FIG. 6C illustrates the case where axis of rotation DA is situated at a distance 2d from the surface of scale T. If scanning unit AEH is rotated at an angle $R_y$ about the axis of rotation DA situated there, the beams reflected at points P, Q, and R on scale T impinge upon points P', Q', and R' on sensor S, as in the non-tilted state according to FIG. 6A. In this position of rotational axis DA, no position offset is therefore detected despite the tilting of scanning unit AEH.

Thus, it is apparent that in the scanning illustrated in FIGS. 6A to 6C, an axis of rotation DA or a point exists in the system about which scanning unit AEH is able to be tilted without causing a change in position in the process. The corresponding axis of rotation DA will hereinafter be termed the neutral axis of rotation and the corresponding point will be termed the neutral pivot point. In the described example illustrated in FIGS. 6A to 6C, the neutral pivot point is situated at twice the scanning distance 2d from the surface of scale T.

In the following text, the neutral pivot point will additionally also be described, for example, with reference to FIGS. 7A to 7C in connection with a further scanning in an optical position-measuring device. In this case, in contrast to the preceding example, no shadow-cast scanning is provided, and scale T is imaged through an imaging lens AL onto sensor S. In the illustrated example of FIGS. 7A to 7C, 1:1 imaging or an image reversal is present, so that points P, Q, and R situated on scale T are imaged onto sensor S in the reverse order R', Q', P'. For reasons of better clarity, only the beam characteristic for central point Q is illustrated.

Figure 7A:
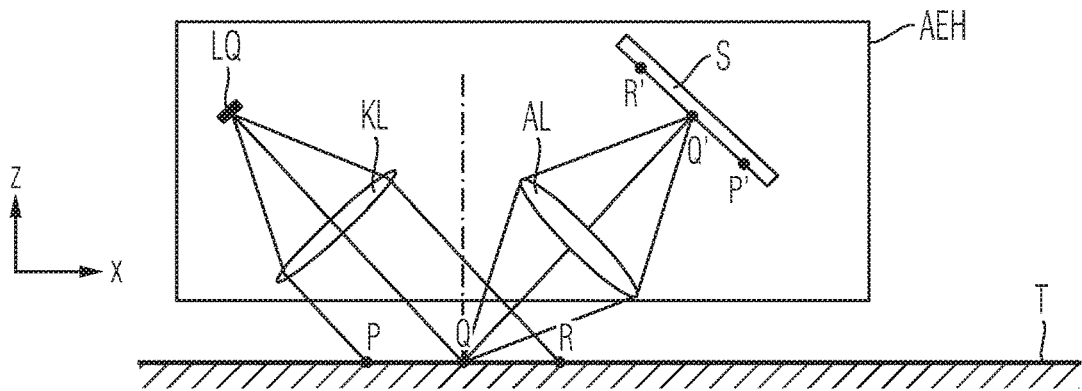
FIGS. 7A to 7C illustrate the neutral pivot point in a second scanning arrangement.
Figure 7B:
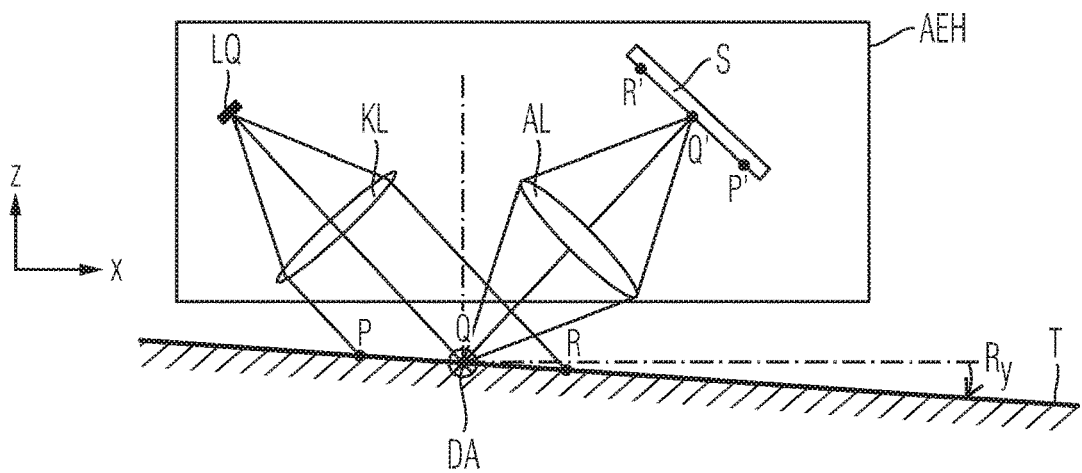

FIG. 7B illustrates the situation where axis of rotation DA extends through point Q on scale T and scanning unit AEH is tilted by angle $R_y$ about axis of rotation DA. Since an imaging system is involved here, point Q is once again imaged to point Q' in sensor S, regardless of the changed illumination direction.

A different situation is encountered if axis of rotation DA extends through point Q' situated in sensor S. In FIG. 7C, tiling at angle $R_y$ about this axis of rotation DA is illustrated. Since the object to be imaged, i.e., point Q on scale T, moves away from the optical axis of imaging lens AL during the tilting, this point Q is also imaged at an offset in the amount of $\Delta x$ to point Q" on sensor S.

Figure 7C:
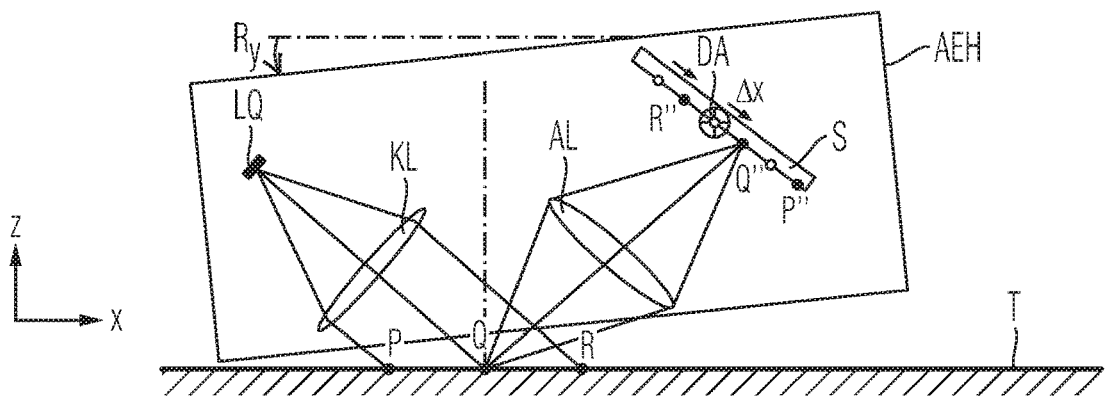

In the scanning example illustrated in FIGS. 7A to 7C, a different position of the neutral pivot point thus results. In contrast to the preceding example illustrated in FIGS. 6A to 6C, the neutral pivot point lies on scale T. A rotation or tilting of scanning unit AEH about a point situated there does not cause a position offset.

The two examples described with reference to FIGS. 6A to 6C and 7A to 7C illustrate that the neutral pivot point in an optical position-measuring device constitutes an important geometrical variable for any scanning variant. More specifically, these two examples illustrate that the neutral pivot points in different scanning operations need not necessarily have to coincide.

Therefore, the following may be stated: if the system in an optical position-measuring device is tilted about the neutral pivot point, then the measured position remains unchanged; and if the system is tilted about some other point, then the measured position changes without an actual position change being present.

Tilting in this case may include either tilting of the scanning unit or the detection unit or tilting of the grating measuring standard.

According to example embodiments of the present invention, the procedure described in German Patent Document No. 11 2005 002 253, and U.S. Pat. No. 7,187,305, for the correction of eccentricity-related errors in rotatory position-measuring device based on the measurement of the rotational-angle-dependent radial offset of the grating measuring, which is carried out during a calibration operation, and the correction of the position value, offset by 90°, by the radial-offset value, which takes place during the measuring operation, is to be expanded to the correction of the tumbling error in an incident light scanning operation. To this end, the radial scanning of the grating measuring standard, which takes place in a calibration operation, has to acquire both the eccentricity deviations and the tumbling deviations of the rotating graduated disk in a correct manner.

In this context, for the correct detection of the tumbling motion, the shift in position of the azimuthal scanning (measuring direction along the x-axis) by an $R_y$ tilt has to be of the same magnitude as the shift in position of the radial scanning (measuring direction along the y-axis) by an $R_x$ tilt. This condition follows from the provided 90° offset of the correction and ultimately means that the neutral pivot points of the azimuthal scanning and the radial scanning have to be located at the same distance from the graduated disk or the grating measuring standard. In other words, the neutral pivot points of the scanning of the grating measuring standard for determining the rotational angle and the displacement have to lie in the same plane, with this plane being situated in parallel with the grating measuring standard.

These correlations are able to be described by the following relationships.

To begin with, in an expansion of relationship 2, the following applies to the measured rotational angle value of the azimuthal incident light scanning:

$$\varphi_{meas}(\theta) = \theta + \Delta\varphi_{ecc}(\theta) + \Delta\varphi_{tilt}(\theta) \tag{Eq. 9}$$

in which $\theta$ represents the rotational angle of the graduated disk, $\varphi_{meas}(\Theta)$ represents the rotational angle value of the azimuthal scanning, $\Delta\varphi_{ecc}(\Theta)$ represents the eccentricity-related rotational angle error, and $\Delta\varphi_{tilt}(\Theta)$ represents the tumbling-related rotational angle error.

Added to the eccentricity-related rotational angle error $\Delta\varphi_{ecc}(\Theta)$ in the case of the incident-light scanning of a reflective grating measuring standard thus is the error contribution caused by the tumbling-related rotational angle error $\Delta\varphi_{tilt}(\Theta)$, which may be described as follows:

$$\Delta\varphi_{tilt}(\theta) = \frac{1}{R} \cdot \Delta z_A \cdot R_y(\theta) \tag{Eq. 10}$$

in which $\theta$ represents the rotational angle of the graduated disk, $\Delta\varphi_{tilt}(\Theta)$ represent the tumbling-related rotational angle error, R represents the scanning radius, $\Delta z_a$ represents the distance of the neutral pivot point of the azimuth scanning from the graduated disk, and $R_y(\Theta)$ represents the tilting of the graduated disk about the y-axis at the scanning point.

It then follows from relationships 9 and 10 that:

$$\varphi_{meas}(\theta) = \theta + \Delta\varphi_{ecc}(\theta) + \frac{1}{R} \cdot \Delta z_A \cdot R_y(\theta) \tag{Eq. 11}$$

in which $\theta$ represents the rotational angle of the graduated disk, $\varphi_{meas}(\Theta)$ represents the rotational angle value of the azimuthal scanning, $\Delta\varphi_{ecc}(\Theta)$ represents the eccentricity-related rotational angle error, R represents the scanning radius, $\Delta z_a$ represents the distance of the neutral pivot point of the azimuth scanning from the graduated disk, and $R_y(\Theta)$ represents the tilting of the graduated disk about the y-axis at the scanning point.

In this case the coordinate system is selected such that the center point of the graduated disk lies in the coordinate origin and the azimuthal scanning point lies at the location having the coordinates x=0, y=R.

Analogous to relationship 9, the following applies to measured value $\Delta r_{meas}(\Theta)$ of the radial incident light scanning:

$$\Delta r_{meas}(\theta) = \Delta r_{ecc}(\theta) + \Delta r_{tilt}(\theta) \tag{Eq. 12}$$

in which $\theta$ represents the rotational angle of the graduated disk, $\Delta r_{meas}(\Theta)$ represents the measured value of the radial incident light scanning, and $\Delta r_{ecc}(\Theta)$ represents the eccentricity-related radial measured value.

In this context, the following applies to variable $\Delta r_{tilt}(\Theta)$, i.e., the tumbling-related radial measured value:

$$\Delta r_{tilt}(\theta) = \Delta z_R \cdot R_x(\theta) \tag{Eq. 13}$$

in which $\theta$ represents the rotational angle of the graduated disk, $\Delta r_{tilt}(\Theta)$ represents the tumbling-related radial measured value, $\Delta z_R$ represents the distance of the neutral pivot point of the radial scanning from the graduated disk, and $R_x(\Theta)$ represents the tilting of the graduated disk about the x-axis at the scanning point.

It should be noted that the measured value of the radial incident-light scanning $\Delta r_{meas}(\Theta)$ according to relationship 12 includes both the actual eccentricity-related radial deflection of graduated disk $\Delta r_{ecc}(\Theta)$ and the tumbling-related radial shift of the light pattern, which is denoted by $\Delta r_{tilt}(\Theta)$ and is referred to as tumbling-related radial measured value in the following text.

It then follows from relationships 12 and 13:

$$\Delta r_{meas}(\theta) = \Delta r_{ecc}(\theta) + \Delta z_R \cdot R_x(\theta) \tag{Eq. 14}$$

in which θ represents the rotational angle of the graduated disk, $\Delta r_{meas}(\Theta)$ represents the measured value of the radial incident light scanning, $\Delta r_{ecc}(\Theta)$ represents the eccentricity-related radial measured value, $\Delta z_R$ represents the distance of the neutral pivot point of the radial scanning from the graduated disk, and $R_x(\Theta)$ represents the tilting of the graduated disk about the x-axis at the scanning point.

The tumbling motion of the graduated disk is described by the following relationship:

$$R_x(\theta) = R_y\left(\theta + \frac{\pi}{2}\right) \quad \text{(Eq. 15)}$$

in which θ represents the rotational angle of the graduated disk, $R_x(\Theta)$ represents the tilting of the graduated disk about the x-axis at the scanning point, and $R_y(\Theta)$ represents the tilting of the graduated disk about the y-axis at the scanning point.

If one divides relationship 14 by R and inserts relationship 5 and relationship 15 into relationship 14, then the following results:

$$\frac{1}{R} \cdot \Delta r_{meas}(\theta) = \Delta \varphi_{ecc}\left(\theta + \frac{\pi}{2}\right) + \frac{1}{R} \cdot \Delta z_R \cdot R_y\left(\theta + \frac{\pi}{2}\right) \quad \text{(Eq. 16)}$$

An eccentricity and tumbling correction according to the afore-described method presupposes that the tumbling contributions in the azimuth scanning (relationship 11) and in the radial scanning (relationship 16) are identical, that is to say:

$$\Delta z_R = \Delta z_A \quad \text{(Eq. 17)}$$

in which $\Delta z_a$ represents the distance of the neutral pivot point of the azimuth scanning from the graduated disk and $\Delta z_R$ represents the distance of the neutral pivot point of the radial scanning from the graduated disk.

A complete angle correction of eccentricity and tumbling deviations is able to be carried out analogous to relationship 6 according to the following relationship:

$$\varphi_{corr}(\theta) = \frac{1}{R} \cdot \Delta r_{meas}(\theta) \quad \text{(Eq. 18)}$$

in which θ represents the rotational angle of the graduated disk, $\phi_{corr}(\Theta)$ represents the rotational-angle-dependent correction value, R represents the scanning radius, and $\Delta r_{meas}(\Theta)$ represents the measured value of the radial incident light scanning.

The angle θ may again be approximately replaced by the measured (faulty) angle value $\varphi_{meas}(\Theta)$. Thus, the following results for the output, corrected angular position $\varphi_{out}$:

$$\varphi_{out} = \varphi_{meas} - \varphi_{corr}\left(\varphi_{meas} - \frac{\pi}{2}\right) \quad \text{(Eq. 19)}$$

in which $\varphi_{out}$ represents the output, corrected angular position, $\varphi_{meas}(\Theta)$ represents the rotational angle value of the azimuthal scanning, and $\varphi_{corr}(\Theta)$ represents the rotational-angle-dependent correction value.

If the above relationship 17 with regard to equal distances of the neutral pivot points of both scans from the graduated disk or the grating measuring standard is not observed, then the described correction does compensate for the eccentricity-related rotational angle error $\Delta \varphi_{ecc}(\Theta)$ but not for the tumbling-related rotational angle error $\Delta \varphi_{tilt}(\Theta)$ (See, e.g., FIG. 5). The remaining residual error is large especially if a cost-effective production of the shaft and/or the graduated disk driving collar including correspondingly large tolerances is desired and large tumbling motions occur as a result.

In summary, the optical position-measuring device for acquiring the rotational angle between two objects that are able to rotationally move relative to each other may be characterized as follows. For example, the corresponding position-measuring device has a rotating graduated disk including a grating measuring standard, which is arranged as a reflection grating. From its scanning, it is possible to obtain position information both about an azimuthal rotary movement about the axis of rotation and a radial displacement of the grating measuring standard. At least one detection unit is used for scanning the rotating grating measuring standard in order to determine the azimuthal rotational angle as well as a radial displacement of the grating measuring standard. During a calibration operation, using a signal processing unit, which is appropriately configured in terms of its software and/or hardware, the radial displacement of the graduated disk is ascertained across a rotation as a function of the rotational angle after the graduated disk as well as the detection units have been mounted in the respective application. The measured values regarding the radial displacement of the graduated disk obtained in the process are then stored in the form of a table in a memory of the signal processing unit; it is furthermore possible to store a corresponding correction curve also in the form of interpolation points, for instance. During a measuring operation and using the signal processing unit, the measured rotational angle value of the azimuthal scanning is corrected by the correction value, offset by 90°, from the memory for eccentricity- and tumbling-related errors, e.g., according to relationship 19, and a corrected angular position $\varphi_{out}$ is output. The correction may also be performed by a linear interpolation between the interpolation points stored in the memory. Instead of a correction via interpolation points, a correction may alternatively also be obtained using a sinusoidal or cosine-shaped correction function, in which case its amplitude and phase position is determined from measured values $\Delta r_{meas}$ and a corresponding fit. This procedure, and in particular the desired tumbling compensation in the case of incident light scanning, requires the neutral pivot points of the scanning of the grating measuring standard for a determination of the rotational angle and displacement to be situated in the same plane and in parallel with the grating measuring standard. If this is not ensured, the output angular position (pout would then be corrected to an insufficient or an excessive degree.

Figure 8A:
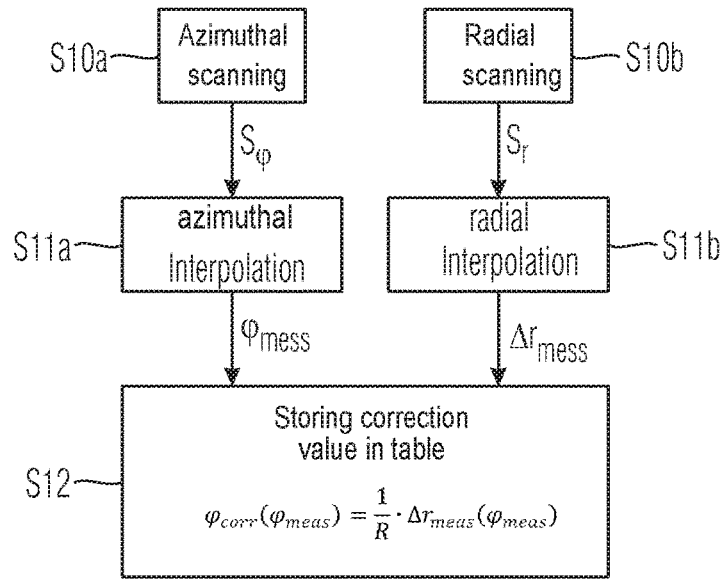
FIGS. 8A and 8B illustrate the procedure during a calibration and measuring operation of the position-measuring device.
Figure 8B:
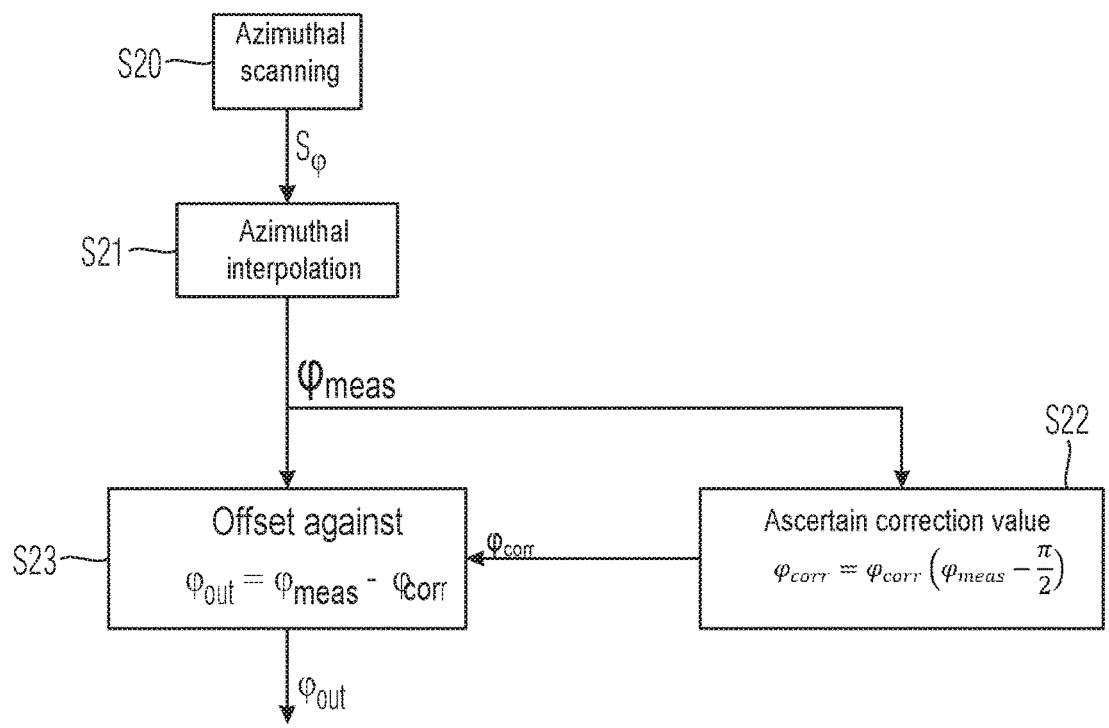

In FIGS. 8A and 8B, the procedure in a calibration operation (FIG. 8A) and in a measuring operation (FIG. 8B) is illustrated schematically for an optical position-measuring device.

According to FIG. 8A, in a calibration operation, while the graduated disk or the grating measuring standard is rotating across a full rotation, the signals for the radial displacement and for the rotational angle of the graduated disk are generated in method steps S10a, S10b via the corresponding scans. The corresponding signals are denoted by $S_r$ (radial displacement) and $S_\varphi$ (azimuthal rotational angle). In method steps S11a, S11b, generated signals $S_r$, $S_\varphi$ are interpolated in an appropriately configured signal processing unit and converted into corresponding position signals $\Delta r_{meas}$, $\varphi_{meas}$, in which case $\Delta r_{meas}$ denotes the position value of the radial measurement and $\varphi_{meas}$ denotes the position value of the azimuthal measurement. In subsequent method step S12, a correction table is filled in in a memory of the signal processing unit, for which purpose a correction value $\varphi_{corr}(\theta)$ is calculated for each angle $\theta$ which is used for the correction of the eccentricity- and tumbling-related rotational angle errors. Correction values $\varphi_{corr}(\theta)$ may also be recorded only at certain interpolation points across the circumference of the graduated disk.

In method step S12, with the aid of a fit, it is also possible to obtain parameters of a (e.g., sinusoidal) correction function such as an amplitude and a phase from the position signals $\Delta r_{meas}$, $\varphi_{meas}$ recorded at certain interpolation points.

In FIG. 8B, the measuring operation of a position-measuring device is schematically illustrated. No acquisition of the radial displacement of the graduated disk takes place any longer in the measuring operation. According to method step S20, only the generation of signals $S_\varphi$ with regard to the azimuthal rotational angle of the graduated disk is provided. Signals $S_\varphi$ are interpolated in method step S21 via the signal processing unit and converted into position signals $\varphi_{meas}$. In method step S22, using correction values $\varphi_{corr}(\theta)$ according to the indicated relationship from method step S12 of the calibration operation or a correction function, correction value $\varphi_{corr}$ for the respective rotational angle $\Theta$ is ascertained via the signal processing unit and offset in method step S23 together with measured value $\varphi_{meas}$ so as to produce output, corrected angular position $\varphi_{out}$ according to the indicated relationship. Since the correction table is populated only at a finite number of interpolation points, the ascertainment of the correction value in method step S22 generally requires an interpolation, e.g., of conventional type.

FIGS. 9A, 9B, 10A, and 10B schematically illustrate example embodiments of optical position-measuring devices. The two exemplary embodiments firstly differ in the used grating measuring standard and secondly in the scanning for the acquisition of the azimuthal rotational angle and the radial displacement of the grating measuring standard or graduated disk.

Figure 9A:
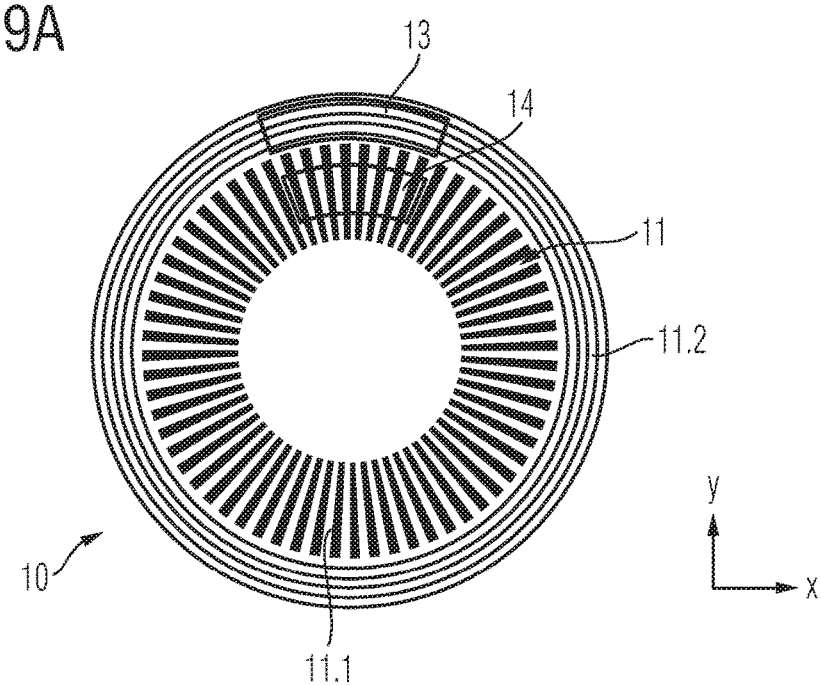
FIG. 9A is a top view of a graduated disk of a position-measuring device according to an example embodiment of the present invention.
Figure 9B:
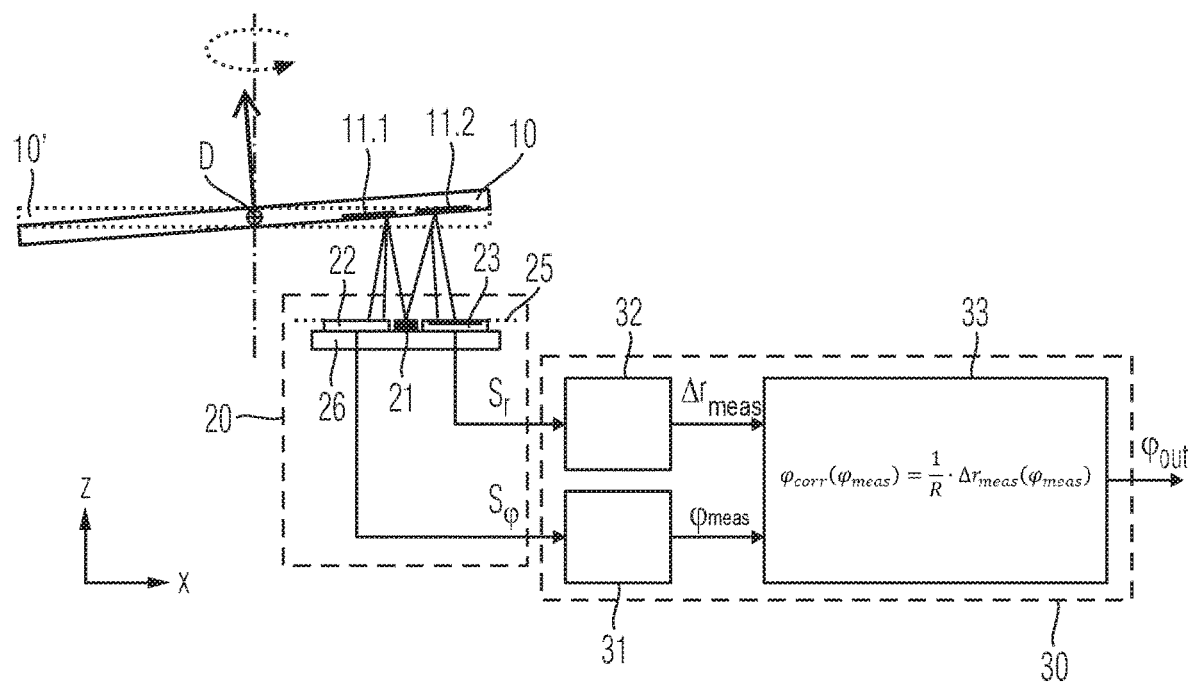
FIG. 9B is a cross-sectional view of the position-measuring device having the graduated disk illustrated in FIG. 9A.

The exemplary embodiment illustrated in FIGS. 9A and 9B uses a graduated disk 10 having a grating measuring standard, such as that described, for example, in German Patent Document No. 11 2005 002 253, and U.S. Pat. No. 7,187,305.

According to the top view of the graduated disk of FIG. 9A, grating measuring standard 11, which is arranged as a reflection grating, has a radial graduation 11.1 situated on the inside and an adjacently situated annular graduation 11.2 disposed on the outside. The two graduations 11.1, 11.2 are disposed in two separate ring-shaped tracks on graduated disk 10 in this instance. The radial graduation 11.1 includes radially oriented grating regions having different reflective properties for the light incident upon them, and the annular graduation 11.2 includes ring-shaped grating regions. The grating regions shown as light regions in the different graduations 11.1, 11.2 have a highly reflective configuration, while the dark grating regions have a low reflectivity. Reference numeral 13 in FIG. 9A denotes the scanning point of a first detection unit on radial graduation 11.1. The first detection unit is used for scanning radial graduation 11.1 and for measuring azimuthal angle $\theta$ of graduated disk 10 during a calibration and measuring operation. Reference numeral 14 in FIG. 9A denotes the scanning point of a second detection unit on annular graduation 11.2. The second detection unit is used for scanning annular graduation 11.2 and thus for measuring the radial deflection of graduated disk 10 during a calibration operation.

FIG. 9B is a side view of the position-measuring device. As illustrated, graduated disk 10 together with grating measuring standard 11 disposed thereon in the form of radial and annular graduation 11.1, 11.2 is tilted about pivot point D, which results in a tumbling motion of graduated disk 10 during the rotation about the axis of rotation. Indicated by dashed lines in FIG. 9B is non-tilted graduated disk 10' in the case of an ideal placement. Also illustrated in FIG. 9B is first detection unit 22, which is allocated to a scanning unit 20 and used for scanning radial graduation 11.1. Reference numeral 23 denotes a second detection unit, which is used for scanning annular graduation 11.2. The two detection units 22, 23 include optoelectronic detectors in each case, which are arranged as structured photodetectors, for instance. In this exemplary embodiment, the two detection units 22, 23 share a light source 21, which is centrically situated in scanning unit 20 on a circuit board 26 and emits beam bundles in divergent form in the direction of graduated disk 10, where the beam bundles are reflected onto the two detection units 22, 23 by the two tracks of grating measuring standard 11.

In addition, a signal processing unit 30, which is allocated to the position-measuring device, is schematically illustrated in FIG. 9B. The signal processing unit 30 assumes the further processing of signals $S_r$, $S_\varphi$ regarding the radial displacement of the graduated disk and regarding the azimuthal rotational angle acquired by detection units 22, 23. Via the two interpolation units 31, 32, measured value $\Delta r_{meas}$ of the radial deflection as well as measured value $\varphi_{meas}$ regarding the rotational angle of graduated disk 10 are able to be determined in signal processing unit 30 during a calibration and measuring operation and be further processed according to the afore-described procedure with the aid of unit 33 so as to form an output angular position $\varphi_{out}$, which is corrected for eccentricity and tumbling.

The neutral pivot point of the scanning for acquiring the azimuthal rotational angle via first detection unit 22 in this exemplary embodiment lies in the same plane as the neutral pivot point of the scanning for acquiring the radial deflection of graduated disk 10 via second detection unit 23. Specifically, both neutral pivot points lie in detection plane 25 of the two detection units 22, 23, and thus in parallel with grating measuring standard 11.

It should also be mentioned in connection with this exemplary embodiment that the radial scanning using the illumination direction tilted in the radial measuring direction does not cause any additional measuring error by the distance changes that go hand-in-hand with the tumbling of graduated disk 10. This is ensured by divergent light source 21 situated in detection plane 25.

Figure 10A:
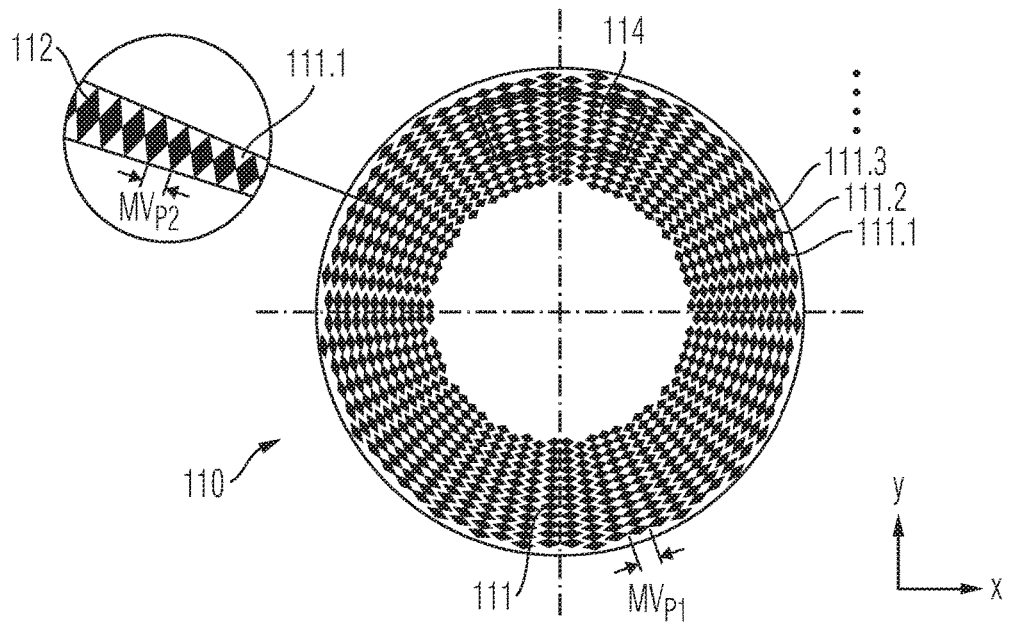
FIG. 10A is a top view of the graduated disk of a position-measuring device according to an example embodiment of the present invention.
Figure 10B:
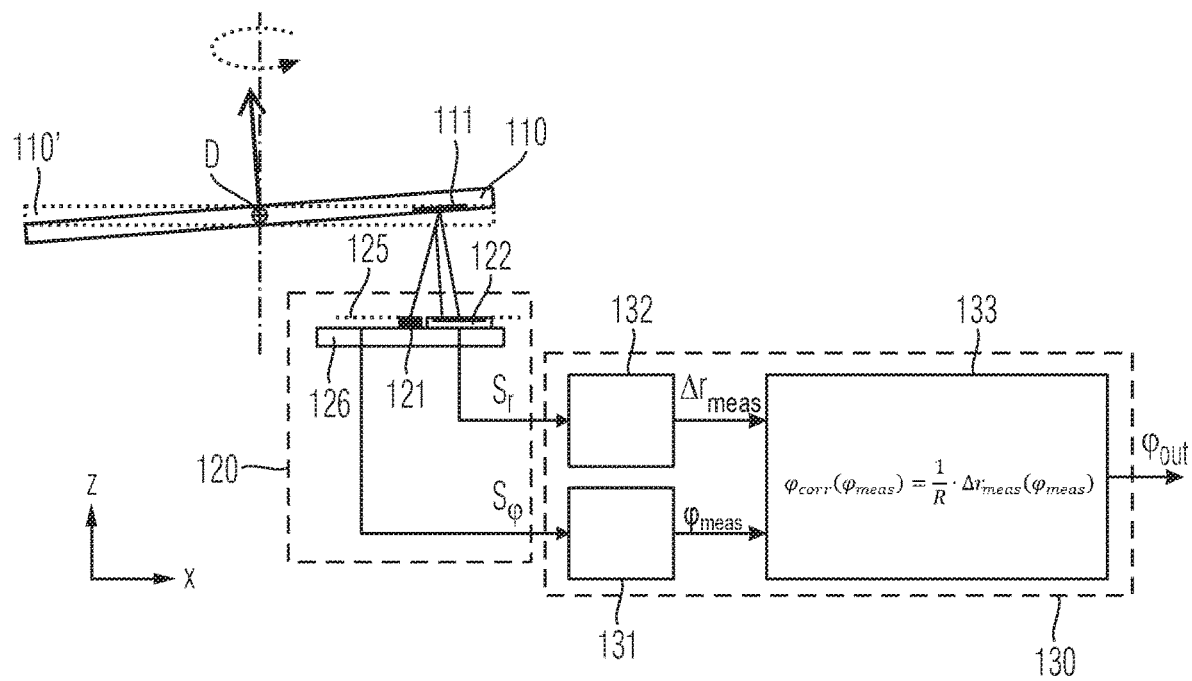
FIG. 10B is a cross-sectional view of the position-measuring device having the graduated disk illustrated in FIG. 10A.

FIGS. 10A and 10B illustrates an example embodiment of a position-measuring device, which, similar to the previous example, once again show the plan view of graduated disk 110 as well as a side view of a position-measuring device in connection with further components of the position-measuring device. Only the main differences from the first exemplary embodiment will be addressed in the following text. In all other respects, however, reference is made to the description of the first exemplary embodiment as well as FIGS. 9A and 9B.

As far as grating measuring standard 111 and the associated scanning or detection unit are concerned, which are used in this exemplary embodiment, reference to German Patent Document No. 10 2018 200 449 and U.S. Patent Application Publication No. 2019/0219422, each of which is expressly incorporated herein in its entirety by reference thereto.

As illustrated in FIG. 10A, a grating measuring standard 111 is provided, which has a configuration that differs from the previously described example embodiment and is situated in a ring-shaped track on graduated disk 110. Reference numeral 14 in FIG. 10A denotes the single provided scanning point. Grating measuring standard 111, which in this instance is once again arranged as a reflection grating, includes stripe elements 111.1, 111.2, 111.3, . . . , which are disposed in an annular and periodic manner at a first measuring standard periodicity $MV_{P1}$, with the stripe elements having a radial orientation in the longitudinal extension direction. Furthermore, for an absolute position encoding, stripe elements 111.1, 111.2, 111.3, . . . have a periodic structure along their longitudinal extension direction, the periodic structure having structure elements 112, which have a second measuring standard periodicity $MV_{P2}$. For instance, the phase position of structure elements 112 may be used for an absolute position encoding of stripe elements 111.1, 111.2, 111.3, . . . , so that each stripe element 111.1, 111.2, 111.3, . . . may be allocated a certain code value in this manner. This makes it possible to provide code sequences across the circumferential direction, which uniquely characterize an angular position within 360°.

In contrast to the preceding exemplary embodiment, the grating regions of grating measuring standard 111 shown as dark in FIG. 10A are highly reflective and the light grating regions have a low reflective configuration.

Analogous to the previous exemplary embodiment, this exemplary embodiment is illustrated in FIG. 10B in a schematic side view. As illustrated in FIG. 10B, only one detection unit is provided on the scanning side in scanning unit 120 for scanning grating measuring standard 111 disposed in a track. The detection unit includes only a single divergent light source 121, e.g., an LED, as well as a single detector system 122, which is periodically arranged along at least one direction. Light source 121 is situated next to detector system 122 on a circuit board 126 in scanning unit 120.

In this case, central projection scanning using image scale $\beta=2$ is provided for the optical scanning of grating measuring standard 111. Grating measuring standard 111 reflects the light emitted by light source 121 back into the detection plane of detector system 122. Image scale $\beta=2$ exists when the distance from light source 121 to grating measuring standard 111 exactly equals the distance from the plane of grating measuring standard 111 to the detection plane. In this case, the structures on grating measuring standard 111 are projected onto detector system 122 at precisely twice their size. In this regard, reference is also made to the description of FIGS. 6 and 7 of the previously-mentioned German Patent Document No. 10 2018 200 449 and U.S. Patent Application Publication No. 2019/0219422.

In a modified variant, it is also possible to use a different image scale $\beta \neq 2$, i.e., when the emission plane of the light source is not situated exactly in the detection plane.

As in the first exemplary embodiment, the divergent light source, which is disposed in the detection plane, ensures that the distance changes resulting from the tumbling motion of the graduated disk do not cause any additional measuring errors.

For example, detector system 122 is arranged as a two-dimensional detector system having a plurality of detector elements, which have multiple detector columns with a plurality of detector elements in each case. The detector columns are periodically disposed along the ring-shaped placement direction at a first detection periodicity, while the detector elements in the detector columns are periodically disposed at a second detection periodicity. In this context as well, reference is again made to German Patent Document No. 10 2018 200 449 and U.S. Patent Application Publication No. 2019/0219422.

In this exemplary embodiment, the provided scanning makes it possible to acquire the azimuthal rotational angle of graduated disk 110 and also the radial deflection of graduated disk 110 from a single track of grating measuring standard 111 on the graduated disk. In this regard, reference is once again made to the description of FIGS. 8a and 8b of German Patent Document No. 10 2018 200 449 and U.S. Patent Application Publication No. 2019/0219422, which describes obtaining information with regard to a tangential or radial offset of the graduated disk and scanning unit with the aid of such scanning.

The neutral pivot points in connection with the rotational angle acquisition and the acquisition of the displacement of graduated disk 110 thus coincide. More specifically, the neutral pivot point lies in detection plane 125 of detector system 122 in this case.

In all other respects, the procedure for correcting the eccentricity- and tumbling-related rotational angle errors from acquired signals $S_r$, $S_\varphi$ with regard to the radial displacement of the graduated disk and with regard to the azimuthal rotational angle is performed as in the previously described example.

In addition to the above-described exemplary embodiments, there are additional alternatives and options within the framework hereof.

For example, there is the option of recording the correction values not only during the calibration operation but also of updating them on a continuous basis during the measuring operation. The radial measured values must be determined for this purpose and the correction values have to be appropriately adapted during the measuring operation as well. This adaptation may take place either directly to the full extent or in a damped manner by averaging using correction values from the past.

It is furthermore possible that the radial scanning and the azimuthal scanning do not take place at the same azimuthal position. In such a case, the correction described by relationship 19 will not take place at a 90° offset but at a corresponding different value, etc.

What is claimed is:

1. An optical position-measuring device for acquiring an rotational angle between two objects that are rotationally moveable relative to each other, comprising:

a grating measuring standard rotatable about an axis of rotation and including a reflection grating, position information relating to an azimuthal rotary movement about the axis of rotation and relating to a radial displacement of the grating measuring standard generatable in accordance with scanning of the grating measuring standard;

at least one detection unit adapted to scan the grating measuring standard to determine an azimuthal rotational angle and the radial displacement of the grating measuring standard; and a signal processing unit;

wherein neutral pivot points of scanning of the grating measuring standard for determining the azimuthal rotational angle and the radial displacement being located in a common plane that is arranged parallel to the grating measuring standard, the neutral pivot point denoting a location about which the grating measuring standard or the detection unit is tiltable without a position offset; and wherein the signal processing unit is configured to:

further process rotational-angle-dependent measured values, obtained during a calibration operation across at least one full rotation of the grating measuring standard, into a radial displacement of the grating measuring standard and store rotational-angle-dependent correction values in a memory of the signal processing unit, and utilize the rotational-angle-dependent correction values stored in the memory in a measuring operation for correction of the measured azimuthal rotational angle with regard to existing eccentricity and tumbling errors.

2. The optical position-measuring device according to claim 1, wherein the grating measuring standard includes a radial graduation and an annular graduation arranged adjacent the radial graduation.

3. The optical position-measuring device according to claim 2, wherein the at least one detection unit includes a first detection unit adapted to scan the radial graduation and a second detection unit adapted to scan the annular graduation.

4. The optical position-measuring device according to claim 1, wherein the grating measuring standard includes stripe elements arranged in an annular and periodic manner at a first measuring standard periodicity, the stripe elements having a radial orientation in a longitudinal extension direction, and for absolute-position encoding, the stripe elements have a periodic structure with a second measuring standard periodicity along the longitudinal extension direction.

5. The optical position-measuring device according to claim 4, wherein the detection unit includes a single light source and a single detector system.

6. The optical position-measuring device according to claim 5, wherein the detector system is arranged as a two-dimensional detector system having a plurality of detector elements and a plurality of detector columns having multiple detector elements, the detector columns being periodically arranged at a first detection periodicity along a ring-shaped placement direction, and the detector elements in the detector columns being periodically arranged at a second detection periodicity.

7. The optical position-measuring device according to claim 1, wherein the optical position-measuring device is configured for optical scanning of the grating measuring standard as central projection scanning using an image scale $\beta=2$, and includes a divergent light source and a detector system having a periodic configuration along at least one direction.

8. The optical position-measuring device according to claim 1, wherein the signal processing unit is configured to utilize the rotational-angle-dependent measured values with regard to a radial displacement of the grating measuring standard, obtained in a calibration operation, in a measuring operation for correction of a rotational angle, offset by 90°, with regard to existing eccentricity and tumbling errors.

9. The optical position-measuring device according to claim 1, wherein the signal processing unit is adapted to correct the rotational angle for present eccentricity and tumbling errors according to:

$$\varphi_{out} = \varphi_{meas} - \varphi_{corr}(\varphi_{meas} - \pi/2)$$

in which $\varphi_{out}$ represents an output, corrected angular position, $\varphi_{meas}(\Theta)$ represents the rotational angle value of the azimuthal scanning, and $\varphi_{corr}(\Theta)$ represents the rotational-angle-dependent correction value.

* * * * *